United States Patent
Park et al.

(10) Patent No.: US 12,131,703 B2
(45) Date of Patent: Oct. 29, 2024

(54) SCAN SIGNAL DRIVING UNIT AND DISPLAY DEVICE INCLUDING THE SAME

(71) Applicant: Samsung Display Co., LTD., Yongin-si (KR)

(72) Inventors: Jun Hyun Park, Suwon-si (KR); Dong Woo Kim, Yongin-si (KR); An Su Lee, Seoul (KR); Kang Moon Jo, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/641,095

(22) PCT Filed: Nov. 26, 2019

(86) PCT No.: PCT/KR2019/016390
§ 371 (c)(1),
(2) Date: Mar. 8, 2022

(87) PCT Pub. No.: WO2021/049715
PCT Pub. Date: Mar. 18, 2021

(65) Prior Publication Data
US 2022/0335899 A1 Oct. 20, 2022

(30) Foreign Application Priority Data
Sep. 9, 2019 (KR) .................... 10-2019-0111684

(51) Int. Cl.
*G09G 3/3266* (2016.01)
*G09G 3/3233* (2016.01)
*G09G 3/3291* (2016.01)

(52) U.S. Cl.
CPC ......... *G09G 3/3266* (2013.01); *G09G 3/3291* (2013.01); *G09G 3/3233* (2013.01);
(Continued)

(58) Field of Classification Search
CPC ........................ G09G 3/3677; G09G 3/3266
See application file for complete search history.

(56) References Cited

U.S. PATENT DOCUMENTS 8,686,980 B2  4/2014  Yoshida et al.
9,385,143 B2  7/2016  Ogasawara et al.
(Continued)

FOREIGN PATENT DOCUMENTS

CN  1885105  12/2006
CN  102713998  10/2012
(Continued)

OTHER PUBLICATIONS

Written Opinion of International Searching Authority dated Jun. 9, 2020 for International Patent Application No. PCT/KR2019/016390.
(Continued)

*Primary Examiner* — Sepehr Azari
(74) *Attorney, Agent, or Firm* — KILE PARK REED & HOUTTEMAN PLLC

(57) ABSTRACT

A scan signal driving unit capable of reducing the RC delay of scan control lines in an ultra-high resolution display, such as 8K UHD. The scan signal driving unit includes a plurality of stages configured to sequentially output scan signals, first clock lines to which first clock signals are applied, and second clock lines to which second clock signals are applied. Each of the first clock lines includes a (1-1)-th metal pattern and a (1-2)-th metal pattern disposed on the (1-1)-th metal pattern. Each of the second clock lines includes a (2-1)-th metal pattern disposed on the same layer as one of the (1-1)-th metal pattern and the (1-2)-th metal pattern.

18 Claims, 34 Drawing Sheets

(52) U.S. Cl.
CPC ............... *G09G 2300/0426* (2013.01); *G09G 2300/0842* (2013.01); *G09G 2310/061* (2013.01); *G09G 2310/08* (2013.01); *G09G 2320/0223* (2013.01)

(56) References Cited

U.S. PATENT DOCUMENTS

| | | | |
|---|---|---|---|
| 10,157,579 B2 | 12/2018 | Han et al. | |
| 10,192,893 B2 | 1/2019 | Cao et al. | |
| 10,236,330 B2 | 3/2019 | Maruyama | |
| 10,424,252 B2 | 9/2019 | Kong | |
| 10,504,467 B2 | 12/2019 | Kim et al. | |
| 10,535,317 B2 | 1/2020 | Jang | |
| 2006/0056267 A1* | 3/2006 | Kim | G09G 3/3677 365/230.06 |
| 2006/0289939 A1 | 12/2006 | Kim et al. | |
| 2009/0115690 A1 | 5/2009 | Chang et al. | |
| 2011/0291097 A1* | 12/2011 | Ogasawara | G02F 1/134336 257/E29.273 |
| 2012/0112197 A1* | 5/2012 | Yoshida | G09G 3/3674 257/E29.273 |
| 2014/0210807 A1* | 7/2014 | Kim | H01L 29/4232 345/212 |
| 2016/0098961 A1* | 4/2016 | Han | G09G 3/3291 345/83 |
| 2017/0059911 A1 | 3/2017 | Choi et al. | |
| 2017/0309242 A1* | 10/2017 | Kim | G02F 1/136286 |
| 2018/0308445 A1* | 10/2018 | Park | G09G 3/3677 |
| 2019/0189075 A1* | 6/2019 | Kim | G09G 3/3677 |
| 2020/0219960 A1* | 7/2020 | Park | H10K 59/131 |

FOREIGN PATENT DOCUMENTS

| | | |
|---|---|---|
| CN | 104617106 | 5/2015 |
| CN | 105489159 | 4/2016 |
| CN | 107305306 | 10/2017 |
| CN | 108269540 | 7/2018 |
| JP | 2017-173505 | 9/2017 |
| KR | 2011-0114677 | 10/2011 |
| KR | 2012-0105553 | 9/2012 |
| KR | 10-1377891 | 3/2014 |
| KR | 10-2017-0120238 | 10/2017 |
| KR | 10-2018-0077804 | 7/2018 |
| KR | 10-2019-0009217 | 1/2019 |

OTHER PUBLICATIONS

International Search Report dated Jun. 9, 2020 in International Application No. PCT/KR2019/016390 (with English Translation).
Office Action issued from the Korean Patent Office on Jan. 31, 2024, for Korean Patent Application No. 2019-0111684 (with English Translation).
Office Action issue from the Chinese Pattent Office on Dec. 27, 2023, for Chinese Patent Application No. 201980099772.6.

* cited by examiner

SCAN SIGNAL DRIVING UNIT AND DISPLAY DEVICE INCLUDING THE SAME

CROSS REFERENCE TO RELATED APPLICATION

This application is a National Stage Entry of International Application No. PCT/KR2019/016390, filed Nov. 26, 2019, which claims priority to and the benefit of Korean Patent Application No. 10-2019-0111684, filed Sep. 9, 2019, each of which is hereby incorporated by reference for all purposes as if fully set forth herein.

BACKGROUND

Field

Embodiments of the invention relate generally to a scan signal driving unit and a display device including the same.

Discussion of the Background

With the advance of an information-oriented society, more and more demands are placed on display devices for displaying images in various ways. For example, display devices are employed in various electronic devices, such as smartphones, digital cameras, laptop computers, navigation devices, and smart televisions. The display device may be a flat panel display device such as a liquid crystal display device, a field emission display device and an organic light emitting display device.

The display device includes a display panel including data lines, scan signal lines, and a plurality of pixels connected to the data lines and the scan signal lines, a scan signal driving unit for supplying scan signals to the scan signal lines, and a data driver for supplying data voltages to the data lines. The scan signal driving unit may be formed in a non-display area of the display panel.

Recently, an ultra-high resolution display device, such as 8K UHD having a resolution of 7680×4320 pixels, has been developed. Due to an increase in the resolution of the display device, scan control lines for applying scan control signals to the scan signal driving unit overlap, so that parasitic capacitances of the scan control lines may be increased. Accordingly, it is difficult to reduce an RC delay of the scan control lines.

The above information disclosed in this Background section is only for understanding of the background of the inventive concepts, and, therefore, it may contain information that does not constitute prior art.

SUMMARY

Embodiments of the present invention provide a scan signal driving unit capable of reducing the RC delay of scan control lines in an ultra-high resolution display, such as 8K UHD.

Embodiments of the present invention also provide a display device capable of reducing the RC delay of scan control lines in an ultra-high resolution, such as 8K UHD.

It should be noted that aspects of the present invention are not limited to the above-mentioned aspects, and other unmentioned aspects of the present invention will be clearly understood by those skilled in the art from the following descriptions.

An embodiment of the present invention provides a scan signal driving unit including a plurality of stages configured to sequentially output scan signals, first clock lines to which first clock signals are applied, and second clock lines to which second clock signals are applied. Each of the first clock lines includes a (1-1)-th metal pattern and a (1-2)-th metal pattern disposed on the (1-1)-th metal pattern. Each of the second clock lines includes a (2-1)-th metal pattern disposed on the same layer as one of the (1-1)-th metal pattern and the (1-2)-th metal pattern.

A minimum distance between one of the plurality of stages and one of the first clock lines may be greater than a minimum distance between one of the plurality of stages and one of the second clock lines.

The scan signal driving unit may further include first connection lines configured to connect the plurality of stages and the first clock lines, and second connection lines configured to connect the plurality of stages and the second clock lines.

A length of one of the first connection lines may be greater than a length of one of the second connection lines.

One of the first connection lines may overlap the (1-2)-th metal pattern of one of the first clock lines, and may not overlap the (1-1)-th metal pattern of the first clock line.

Each of the first clock lines may include a (1-3)-th metal pattern disposed under the (1-1)-th metal pattern. Each of the second clock lines may include a (2-2)-th metal pattern disposed on the same layer as the (1-3)-th metal pattern.

One of the first connection lines may overlap the (1-3)-th metal pattern of one of the first clock lines.

The scan signal driving unit may further include third clock lines to which third clock signals are applied. Each of the third clock lines may include a (3-1)-th metal pattern disposed on the same layer as the (1-1)-th metal pattern and a (3-2)-th metal pattern disposed on the same layer as the (1-2)-th metal pattern.

A minimum distance between one of the plurality of stages and one of the third clock lines may be greater than a minimum distance between one of the plurality of stages and one of the second clock lines.

The scan signal driving unit may further include third connection lines configured to connect the plurality of stages and the third clock lines.

A length of one of the third connection lines may be greater than a length of the second connection line.

One of the third connection lines may overlap the (3-2)-th metal pattern of one of the third clock lines, and may not overlap the (3-1)-th metal pattern of the third clock line.

Each of the third clock lines may include a (3-3)-th metal pattern disposed under the (3-1)-th metal pattern.

One of the third connection lines may overlap the (3-3)-th metal pattern of one of the third clock lines.

Another embodiment of the present invention provides a display device including a display panel including data lines, scan signal lines and sensing signal lines intersecting the data lines, and pixels connected to the data lines, the scan signal lines, and the sensing signal lines, a data driver configured to apply data voltages to the data lines, and a scan signal driving unit including a plurality of stages configured to sequentially apply scan signals to the scan signal lines, and to sequentially apply sensing signals to the sensing signal lines. The scan signal driving unit further includes first clock lines to which first clock signals are applied, and second clock lines to which second clock signals are applied. Each of the first clock lines includes a (1-1)-th metal pattern and a (1-2)-th metal pattern disposed on the (1-1)-th metal pattern. Each of the second clock lines includes a (2-1)-th metal pattern disposed on the same layer as one of the (1-1)-th metal pattern and the (1-2)-th metal pattern.

Each of the pixels may include at least one thin film transistor. The thin film transistor may include a light blocking layer, an active layer disposed on the light blocking layer and including an active region, a source region, and a drain region, a gate electrode disposed on the active layer, a source electrode disposed on the gate electrode and connected to the source region, and a drain electrode disposed on the gate electrode and connected to the drain region.

The (1-1)-th metal pattern may be disposed on the same layer as the gate electrode. The (1-2)-th metal pattern may be disposed on the same layer as the source electrode.

The (1-1)-th metal pattern may be disposed on the same layer as the gate electrode, and the (1-2)-th metal pattern may be disposed between the gate electrode and the source electrode.

Each of the pixels may include at least one thin film transistor. The thin film transistor may include a source electrode and a drain electrode, an active layer disposed on the source electrode and the drain electrode, the active layer including an active region, a source region, and a drain region, and a gate electrode disposed on the active layer.

The (1-1)-th metal pattern may be disposed on the same layer as the source electrode and the drain electrode, and the (1-2)-th metal pattern may be disposed on the same layer as the gate electrode.

In accordance with the scan signal driving unit and the display device according to embodiments, among the scan control lines, each of carry clock lines, sensing clock lines, and scan clock lines is formed in a three-layer structure including three metal patterns. Further, among the scan control lines, each of a sensing control line, a control clock line, a gate-on voltage line, a first gate-off voltage line, and a second gate-off voltage line is formed in a two-layer structure including two metal patterns. As a result, it is possible to reduce the resistance value of each of the scan control line in an ultra-high resolution such as 8K UHD, so that it is possible to reduce the RC delay of the scan control lines.

Advantageous effects according to the present disclosure are not limited to those mentioned above, and various other advantageous effects are included herein.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
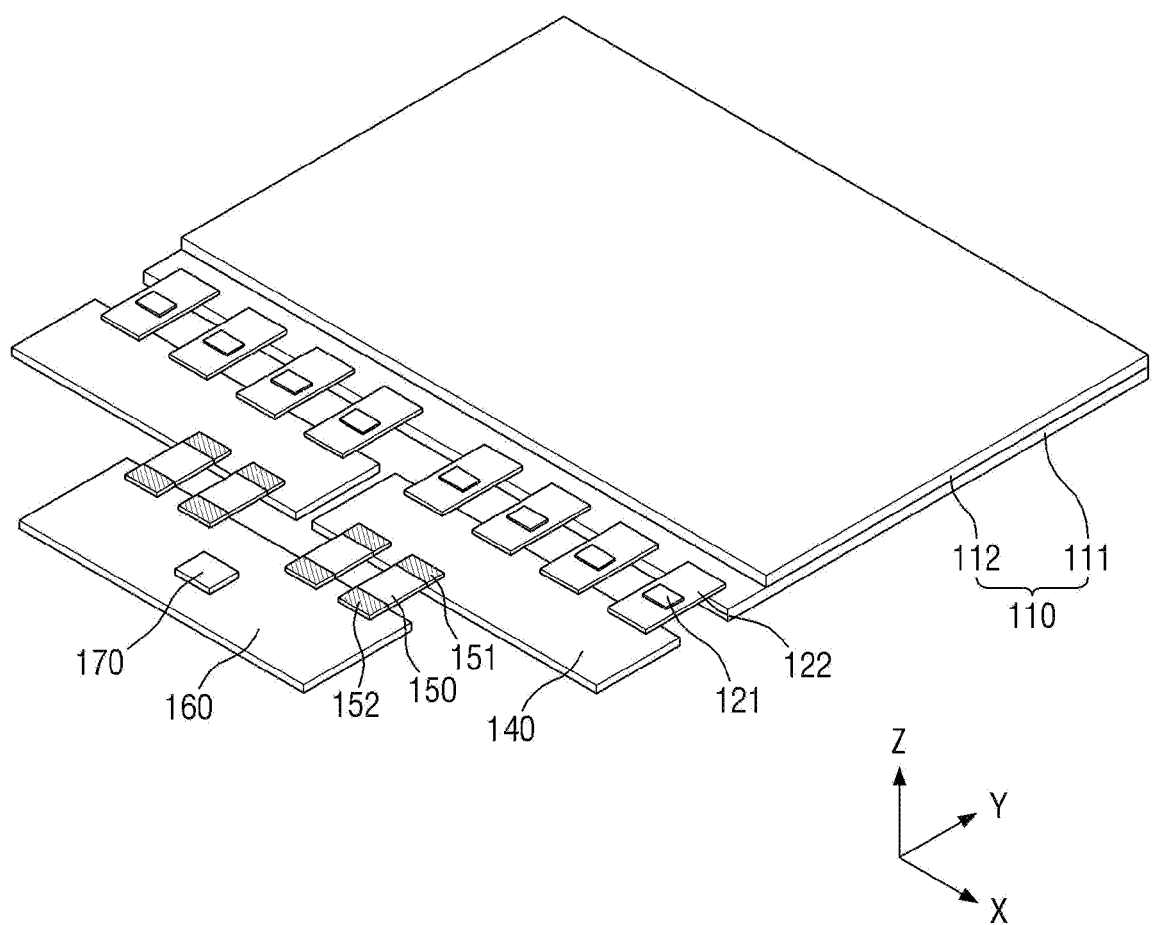
FIG. 1 is a perspective view illustrating a display device according to one embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

As is customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Advantages and features of the present invention and methods of achieving them will become apparent with reference to the embodiments described below in detail in conjunction with the accompanying drawings. However, the present invention is not limited to the embodiments disclosed below, but will be implemented in a variety of different forms, and only these embodiments allow the disclosure of the present invention to be complete, and common knowledge in the technical field to which the present invention belongs It is provided to fully inform the possessor of the scope of the invention, and the present invention is only defined by the scope of the claims.

Reference to an element or layer "on" of another element or layer includes any intervening layer or other element directly on or in the middle of the other element or layer. Like reference numerals refer to like elements throughout. The shapes, sizes, proportions, angles, numbers, etc. disclosed in the drawings for explaining the embodiments are exemplary, and thus the present invention is not limited to the illustrated matters.

Although the first, second, etc. are used to describe various elements, these elements are not limited by these terms, of course. These terms are only used to distinguish one component from another. Accordingly, it goes without saying that the first component mentioned below may be the second component within the spirit of the present invention.

Each feature of the various embodiments of the present invention can be partially or wholly combined or combined with each other, technically various interlocking and driving are possible, and each of the embodiments may be independently implemented with respect to each other or implemented together in a related relationship.

Hereinafter, specific embodiments will be described with reference to the accompanying drawings.

Figure 2:
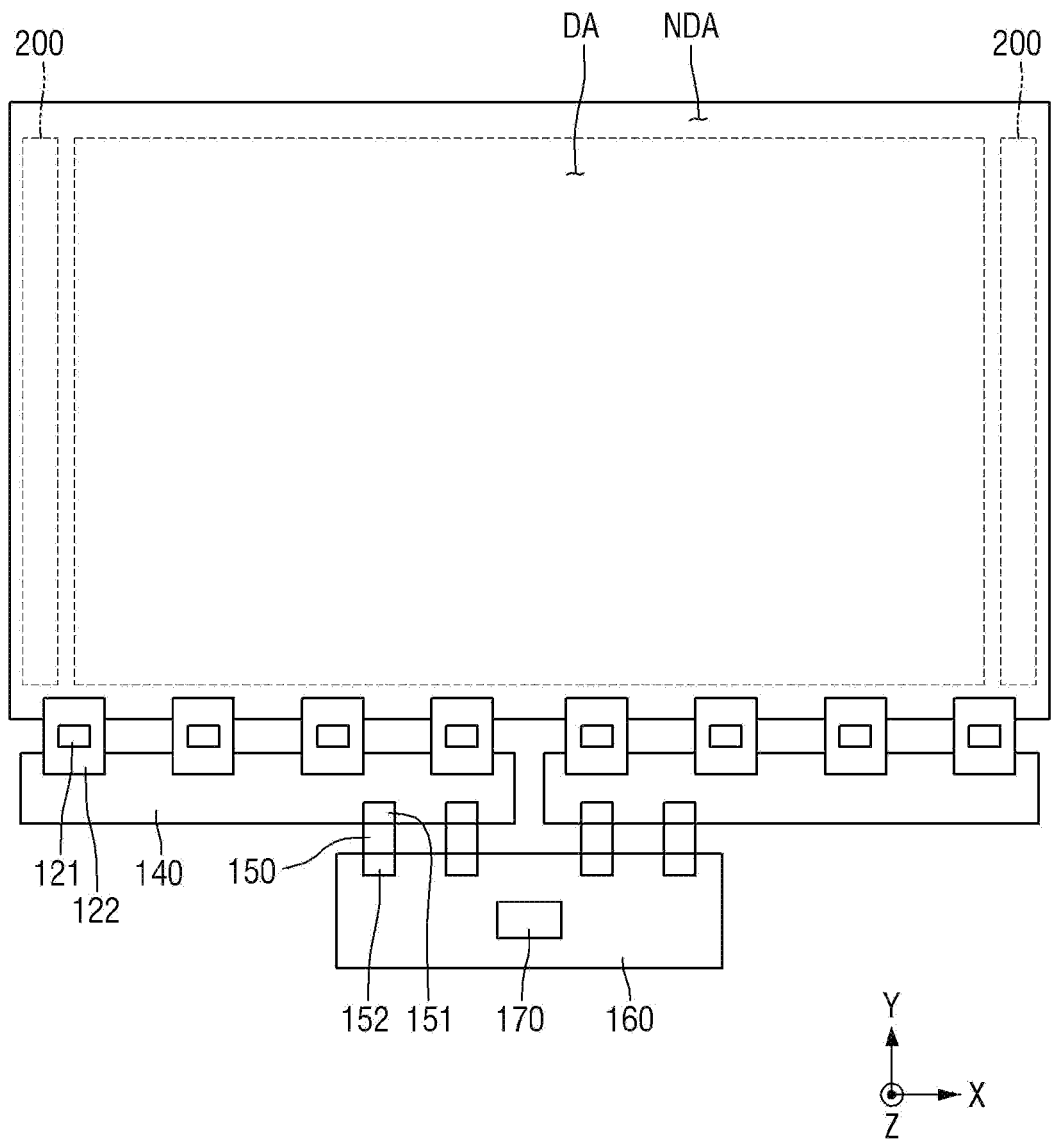
FIG. 2 is a plan view illustrating a display device according to one embodiment.
Figure 3:
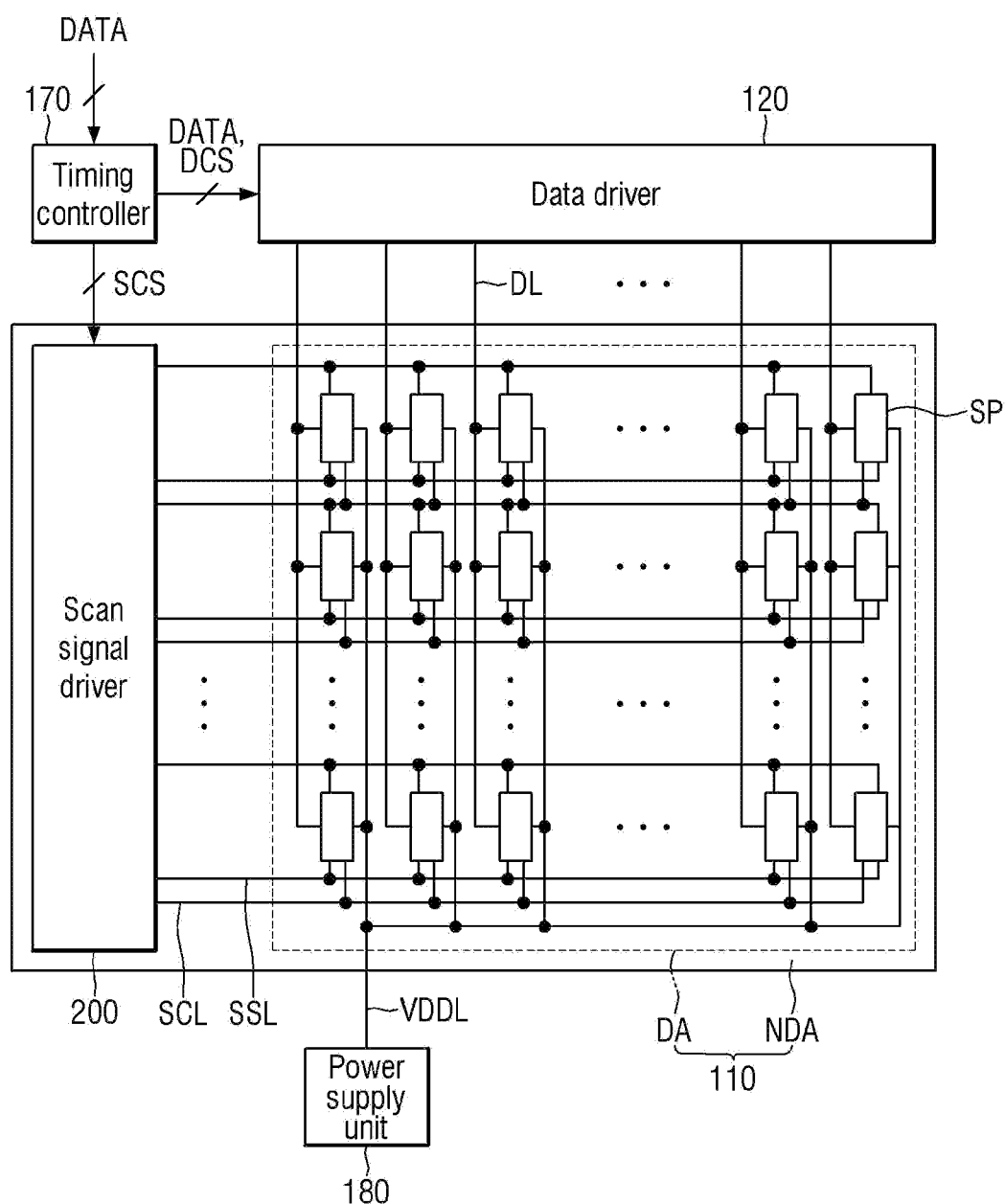
FIG. 3 is a block diagram illustrating a display device according to an embodiment.

FIG. 1 is a perspective view illustrating a display device according to one embodiment. FIG. 2 is a plan view illustrating a display device according to one embodiment. FIG. 3 is a block diagram illustrating a display device according to an embodiment.

The terms "above," "top" and "upper surface" used herein refer to an upward direction (i.e., a Z-axis direction) with respect to a display panel 110. The terms "below," "bottom" and "lower surface" used herein refer to a downward direction (i.e., a direction opposite to the Z-axis direction) with respect to the display panel 110. Further, "left", "right", "upper" and "lower" indicate directions when the display panel 110 is viewed from above. For example, the term "left" indicates a direction opposite to an X-axis direction, the term "right" indicates the X-axis direction, the term "upper" indicates a Y-axis direction, and the term "lower" indicates a direction opposite to the Y-axis direction.

A display device 10 according to one embodiment is a device for displaying a moving image or a still image. The display device 10 may be used as a display screen of various devices, such as a television, a laptop computer, a monitor, a billboard and an Internet-of-Things (TOT) device, as well as portable electronic devices such as a mobile phone, a smartphone, a tablet personal computer (PC), a smart watch, a watch phone, a mobile communication terminal, an electronic notebook, an electronic book, a portable multimedia player (PMP), a navigation device and an ultra-mobile PC (UMPC). In the following description, the display device 10 according to one embodiment is a medium-large display device including a plurality of source drivers 121, but the inventive concepts are not limited thereto. The display device 10 according to one embodiment may be a small display device including one source driver 121, and flexible films 122, source circuit boards 140, and cables 150 may be omitted. Further, when the display device 10 according to one embodiment is a small display device, the source driver 121 and a timing controller 170 may be integrated into one integrated circuit and disposed on one circuit board, or may be adhered onto a first substrate 111 of a display panel 110. For example, the medium-large display device may be a television, a monitor, or the like, and the small display device may be a smart phone, a tablet PC, or the like.

Referring to FIGS. 1, 2, and 3, the display device 10 includes the display panel 110, a data driver 120 including source drivers 121, the flexible films 122, the source circuit boards 140, first cables 150, a control circuit board 160, the timing controller 170, a power supply unit 180, and a scan signal driving unit 200.

The display panel 110 may have a rectangular shape in plan view. For example, the display panel 110 may have a rectangular shape, in plan view, having long sides in a first direction (X-axis direction) and short sides in a second direction (Y-axis direction) as shown in FIG. 2. A corner formed by the long side in the first direction (X-axis direction) and the short side in the second direction (Y-axis direction) may be right-angled or rounded with a predetermined curvature. The planar shape of the display panel 110 is not limited to the rectangular shape, and may be formed in another polygonal shape, a circular shape or an elliptical shape. Further, although FIG. 2 illustrates that the display panel 110 is formed to be flat, the inventive concepts are not limited thereto. The display panel 110 may include a curved portion that is bent with a predetermined curvature.

The display panel 110 may include the first substrate 111 and a second substrate 112. The second substrate 112 may be disposed to face the first surface of the first substrate 111. The first substrate 111 and the second substrate 112 may be formed to be rigid or flexible. The first substrate 111 may be made of glass or plastic. The second substrate 112 may be made of glass, plastic, an encapsulation film, or a barrier film. Alternatively, the second substrate 112 may be omitted.

Further, the display panel 110 may be an organic light emitting display panel using an organic light emitting diode, a quantum dot light emitting display panel including a quantum dot light emitting layer, an inorganic light emitting display panel including an inorganic semiconductor, or a micro light emitting display panel using a micro light emitting diode (LED). In the following description, it is assumed that the display panel 110 is an organic light emitting display panel, but the inventive concepts are not limited thereto.

The display panel 110 may include a display area DA where sub-pixels SP are formed to display an image and a non-display area NDA which is a peripheral area of the display area DA. In the display area DA, not only the sub-pixels SP but also scan signal lines SCL, sensing signal lines SSL, data lines DL, and a first driving voltage line VDDL that are connected to the sub-pixels SP may be disposed. The scan signal lines SCL and the sensing signal lines SSL may extend in the first direction (X-axis direction) in the display area DA. The data lines DL may extend in the second direction (Y-axis direction) intersecting the first direction (X-axis direction) in the display area DA. The first driving voltage line VDDL may extend in the second direction Y in the display area DA.

Each of the sub-pixels SP may be connected to any one of the scan signal lines SCL, any one of the data lines DL, and any one of the sensing signal lines SSL. Although FIG. 2 illustrates that each of the sub-pixels SP is connected to one scan signal line SCL, one data line DL, and one sensing signal line SSL, the inventive concepts are not limited thereto. The sub-pixels SP may be commonly connected to the first driving voltage line VDDL.

Each of the sub pixels SP may include a driving transistor DT, at least one transistor ST, a light emitting element, and a capacitor. The transistor ST may be turned on when a scan signal is applied from the scan signal line SCL, and thus a data voltage of the data line DL may be applied to a gate electrode of the driving transistor DT. The driving transistor DT may emit light by supplying a driving current to the light emitting element according to the data voltage applied to the gate electrode. The driving transistor DT and the at least one switching transistor may be thin film switching transistors. The light emitting element may emit light according to the driving current of the driving transistor DT. The light emitting element may be an organic light emitting diode including a first electrode, an organic light emitting layer and a second electrode. The capacitor may serve to keep constant the data voltage applied to the gate electrode of the driving transistor DT.

The non-display area NDA may be defined as an area from the boundary of the display area DA to the edge of the display panel 110. The scan signal driving unit 200 for applying scan signals to the scan signal lines SCL and sensing signals to the sensing signal lines SSL may be disposed in the non-display area NDA.

The scan signal driving unit 200 may be connected to the flexible films 122 through a plurality of scan control lines. The scan signal driving unit 200 may receive a scan control signal SCS from the timing controller 170 through the plurality of scan control lines. The scan control signal SCS may include a plurality of clock signals, a sensing control signal, a gate-on voltage, and a gate-off voltage. The scan signal driving unit 200 may generate scan signals and sensing signals in response to the scan control signal SCS, and output the scan signals and the sensing signals to the scan signal lines SCL and the sensing signal lines SSL. Although FIG. 2 illustrates that the scan signal driving unit 200 is formed on both sides of the display area DA, e.g., in the non-display area NDA on the left side and the right side of the display area DA, the inventive concepts are not limited thereto. For example, the scan signal driving unit 200 may be formed on one side of the display area DA, e.g., in the non-display area NDA on the left side or the right side of the display area DA.

One sides of the flexible films 122 may be attached to the first surface of the first substrate 111 of the display panel 110, and the other sides of the flexible films 122 may be attached to one surface of the source circuit board 140. Specifically, the size of the second substrate 112 is smaller than the size of the first substrate 111, so that one side of the first substrate 111 may be exposed without being covered by the second substrate 112. The flexible films 122 may be attached to one side of the first substrate 111 that is exposed without being covered by the second substrate 112. Each of the flexible films 122 may be attached to the first surface of the first substrate 111 and one surface of the source circuit board 140 using an anisotropic conductive film.

Each of the flexible films 122 may be a flexible film such as a chip on film or a tape carrier package. The flexible films 122 may be bent to the position below the first substrate 111. In this case, the source circuit boards 140, the first cables 150, and the control circuit board 160 may be disposed on the bottom surface of the display panel 110. Although FIGS. 1 and 2 illustrate that eight flexible films 122 are attached onto the first substrate 111 of the display panel 110, the number of flexible films 122 is not limited thereto in this specification.

The source drivers 121 of the data driver 120 may be respectively disposed on one surfaces of the flexible films 122. The source drivers 121 may be formed as an integrated circuit (IC). The data driver 120 converts digital video data DATA into analog data voltages in response to a source control signal DCS of the timing controller 170, and supplies the analog data voltages to the data lines of the display panel 110 through the flexible film 122.

Each of the source circuit boards 140 may be connected to the control circuit is board 160 through the first cables 150. Each of the source circuit boards 140 may include first connectors 151 to be connected to the first cables 150. The source circuit boards 140 may be a flexible printed circuit board or a printed circuit board. The first cables 150 may be flexible cables.

The control circuit board 160 may be connected to the source circuit boards 140 through the first cables 150. To this end, the control circuit board 160 may include second connectors 152 to be connected to the first cables 150. The control circuit board 160 may be a flexible printed circuit board or a printed circuit board.

Although FIGS. 1 and 2 illustrate that four first cables 150 connect the source circuit boards 140 and the control circuit board 160, the number of first cables 150 is limited thereto in this specification. Further, although FIGS. 1 and 2 illustrate two source circuit boards 140, the number of source circuit boards 140 is not limited thereto in this specification.

Further, when the number of flexible films 122 is small, the source circuit boards 140 may be omitted. In this case, the flexible films 122 may be directly connected to the control circuit board 160.

The timing controller 170 may be disposed on one surface of the control circuit board 160. The timing controller 170 may be formed as an integrated circuit. The timing controller 170 receives the digital video data and timing signals from the system-on-chip of a system circuit board. The timing controller 170 may generate the source control signal DCS for controlling the timing of the source drivers 121 of the data driver 120 and the scan control signal SCS for controlling the timing of the scan signal driving unit 200 in response to the timing signals. The timing controller 170 may output the scan control signal SCS to the scan signal driving unit 200, and output the digital video data DATA and the source control signal DCS to the data driver 120.

The power supply unit 180 may generate a first driving voltage and supply the first driving voltage to the first driving voltage line VDDL. Further, the power supply unit 180 may generate a second driving voltage and supply the second driving voltage to a cathode electrode of the organic light emitting diode of each of the sub-pixels SP. The first driving voltage may be a high potential voltage for driving the organic light emitting diode, and the second driving voltage may be a low potential voltage for driving the organic light emitting diode. That is, the first driving voltage may have a higher potential than the second driving voltage. Further, the power supply unit 180 may generate a reference voltage and supply the reference voltage to a reference voltage line connected to each of the sub-pixels SP.

Figure 4:
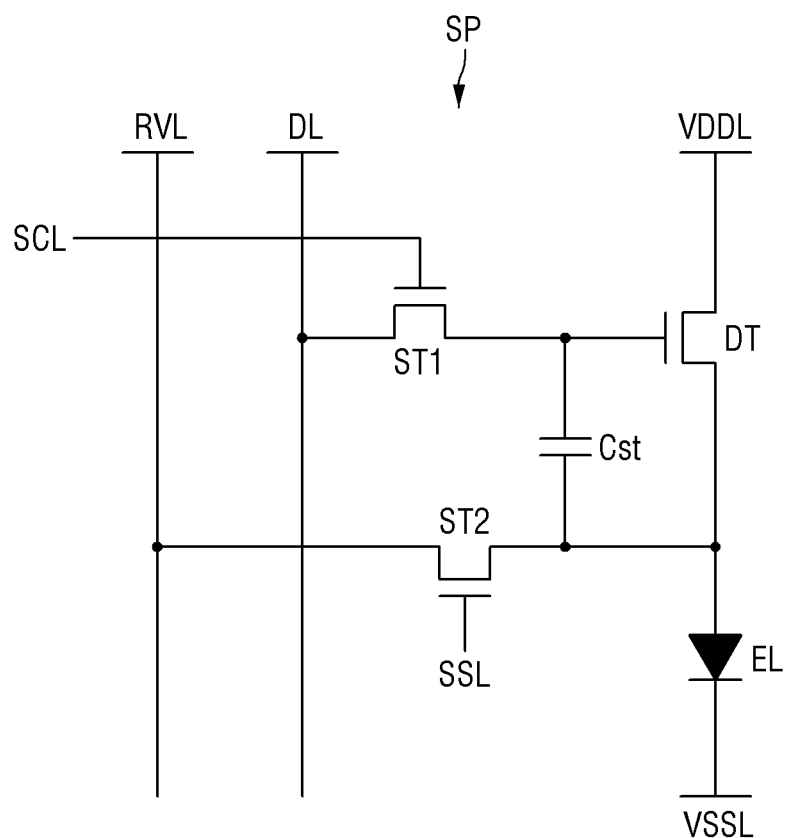
FIG. 4 is a circuit diagram specifically illustrating a sub-pixel according to one embodiment.

FIG. 4 is a circuit diagram specifically illustrating a sub-pixel according to one embodiment.

Referring to FIG. 4, the sub-pixel SP may include a light emitting element EL, a driving transistor DT, a first switching transistor ST1, a second switching transistor ST2, and a capacitor Cst.

The light emitting element EL emits light according to a current supplied through a driving transistor DT. The light emitting element EL may be an organic light emitting diode, but is not limited thereto. For example, the light emitting element EL may be a quantum dot light emitting diode, an inorganic light emitting diode, or a micro light emitting diode. In this case, when the light emitting element EL is an organic light emitting diode, the light emitting element EL may include an anode electrode, a hole transporting layer, an organic light emitting layer, an electron transporting layer, and a cathode electrode. In the light emitting element EL, when a voltage is applied to the anode electrode and the cathode electrode, the holes and electrons move to the organic light emitting layer through the hole transporting layer and the electron transporting layer, respectively, and are combined with each other in the organic light emitting layer to emit light. The anode electrode of the light emitting element EL may be connected to the source electrode of the driving transistor DT, and the cathode electrode may be connected to a second driving voltage line VSSL to which a low potential voltage lower than a high potential voltage is supplied.

The driving transistor DT adjusts a current flowing from the first power line VDDL, to which the first source voltage is applied, to the light emitting element EL according to a voltage difference between a gate electrode and the source electrode. The gate electrode of the driving transistor DT may be connected to the first electrode of the first switching transistor ST1, the source electrode thereof may be connected to the anode electrode of the light emitting element EL, and the drain electrode thereof may be connected to the first driving voltage line VDDL to which the high potential voltage is applied.

The first switching transistor ST1 is turned on by a scan signal applied from the scan signal line SCL to connect the data line DL to the gate electrode of the driving transistor DTR. The gate electrode of the first switching transistor ST1 may be connected to the scan signal line SCL, the first electrode thereof may be connected to the gate electrode of the driving transistor DT, and the second electrode thereof may be connected to the data line DL.

The second switching transistor ST2 is turned on by the sensing signal of the sensing signal line SSL to connect a reference voltage line RVL to the source electrode of the driving transistor DT. The gate electrode of the second switching transistor ST2 may be connected to the sensing signal line SSL, the first electrode thereof may be connected to the reference voltage line RVL, and the second electrode thereof may be connected to the source electrode of the driving transistor DT.

One of the first electrode and the second electrode of each of the first and second switching transistors ST1 and ST2 may be the source electrode, and the other may be the drain electrode.

The capacitor Cst is formed between the gate electrode and the source electrode of the driving transistor DT. The capacitor Cst stores a difference voltage between the gate voltage and the source voltage of the driving transistor DT.

The driving transistor DT, the first switching transistor ST1, and the second switching transistor ST2 may be formed as thin film transistors. Further, although FIG. 4 mainly describes the case where the driving transistor DT and the first and second switching transistors ST1 and ST2 are formed as an N-type metal oxide semiconductor field effect transistor (MOSFET), the inventive concepts are not limited thereto. The driving transistor DT and the first and second switching transistors ST1 and ST2 may be formed as a P-type MOSFET.

Figure 5:
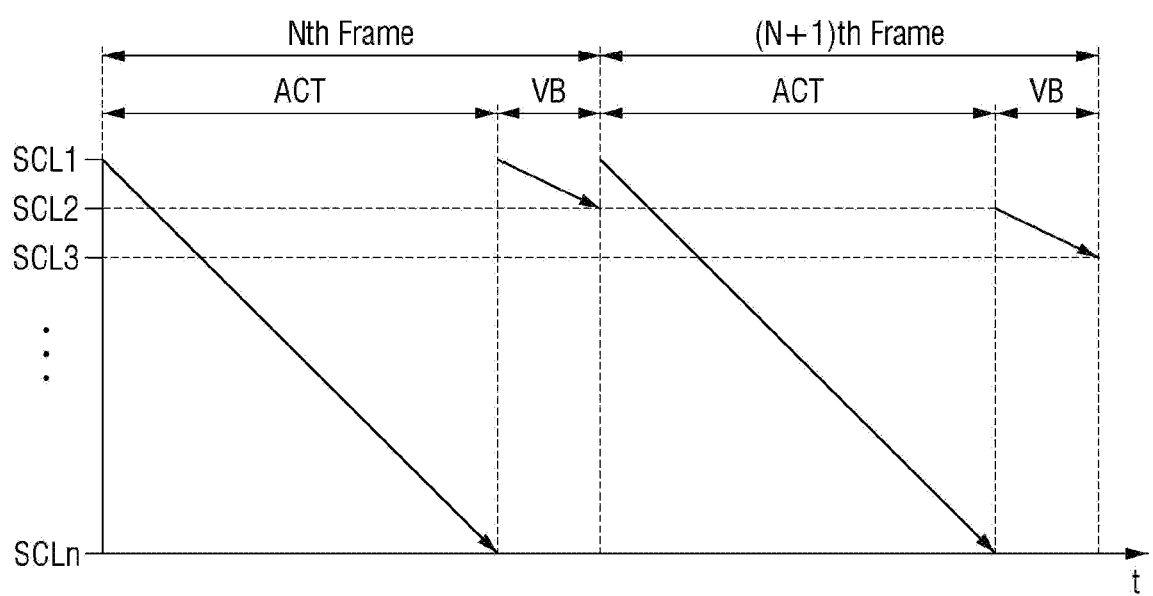
FIG. 5 illustrates an example of the driving timing of sub-pixels in an Nth frame period and an (N+1)th frame period.
Figure 6:
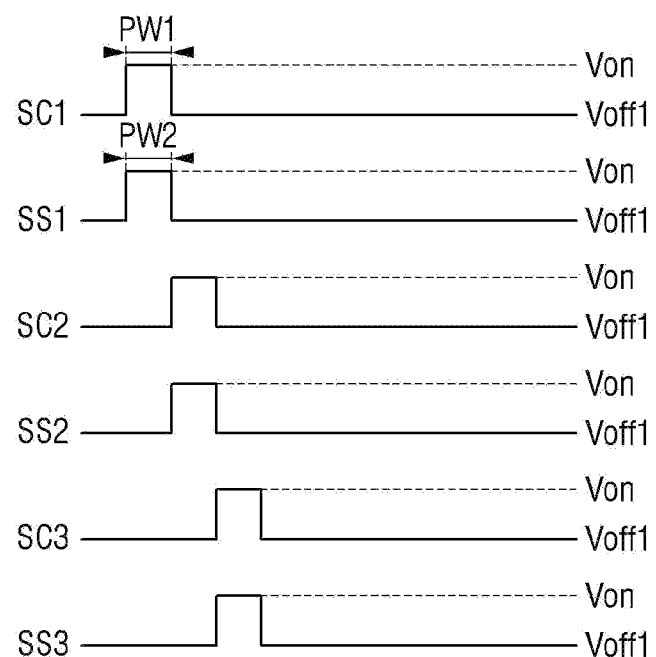
FIG. 6 is a waveform diagram showing kth to (k+2)th scan signals and kth to (k+2)th sensing signals during the active period of the Nth frame period.
Figure 7:
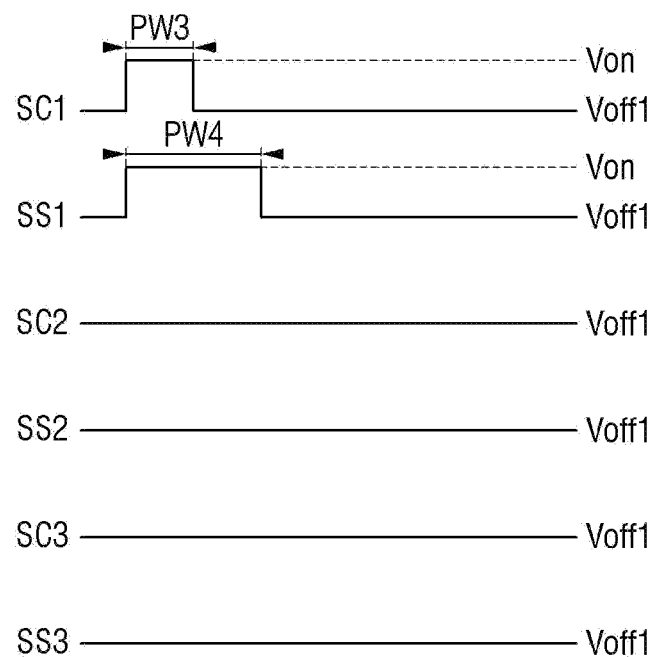
FIG. 7 is a waveform diagram showing kth to (k+2)th scan signals and kth to (k+2)th sensing signals during the vertical blank period of the Nth frame period.

FIG. 5 illustrates an example of the driving timing of sub-pixels in an Nth frame period and an (N+1)th frame period. FIG. 6 is a waveform diagram showing kth to (k+2)th scan signals and kth to (k+2)th sensing signals during the active period of the Nth frame period. FIG. 7 is a waveform diagram showing kth to (k+2)th scan signals and kth to (k+2)th sensing signals during the vertical blank period of the Nth frame period.

Referring to FIGS. 5 to 7, each of the Nth frame period (N being a positive integer) and the (N+1)th frame period includes an active period ACT and a vertical blank period VB. The active period ACT is a period in which a data voltage is applied to each of the sub-pixels SP. The vertical blank period VB, which is an idle period, is a period in which the source voltage of the driving transistor DT of each of the sub-pixels SP connected to at least one scan signal line SCL is sensed through the reference voltage line RVL.

The data driver 120 may apply compensation data voltages that have compensated electron mobility of the driving transistor DT of each of the sub-pixels SP to the data lines DL during the active period ACT. The data driver 120 may apply sensing data voltages for compensating the electron mobility of the driving transistor DT of each of the sub-pixels SP to the data lines DL during the vertical blank period VB.

Further, during the active period ACT, the reference voltage may be applied to the reference voltage line RVL. During the vertical blank period VB, the reference voltage line RVL may be connected to an analog-to-digital converter, and the source voltage of the driving transistor DT of each of the sub-pixels SP may be converted into sensing data that is digital data through the reference voltage line RVL by the analog-to-digital converter and outputted to the timing controller 170.

The length of the active period ACT may be longer than the length of the vertical blank period VB. The vertical blank period VB of the Nth frame period may be disposed between the active period ACT of the Nth frame period and the active period ACT of the (N+1)th frame period.

The scan signal driving unit 200 may sequentially apply the scan signals to the scan signal lines SCL during the active period ACT. When the display panel 110 includes first to nth (n being a positive integer) scan signal lines SCL1 to SCLn as shown in FIG. 5, the scan signal driving unit 200 may sequentially apply the scan signals to the first scan signal line SCL1 to the nth scan signal line SCLn. For example, as shown in FIG. 6, the scan signal driving unit 200 may apply a first scan signal SC1 of a gate-on voltage Von to the first scan signal line SCL1, and then may apply a second scan signal SC2 of the gate-on voltage Von to a second scan signal line SCL2, and then may apply a third scan signal SC3 of the gate-on voltage Von to a third scan signal line SCL3.

Further, the scan signal driving unit 200 may sequentially apply the sensing signals to the sensing signal lines SSL during the active period ACT. When the display panel 110 includes first to nth sensing signal lines, the sensing signals may be sequentially applied to a first sensing signal line to an nth sensing signal line. For example, as shown in FIG. 6, the scan signal driving unit 200 may apply a first sensing signal SS1 of the gate-on voltage Von to a first sensing signal line SSL1, and then may apply a second sensing signal SS2 of the gate-on voltage Von to a second sensing signal line SSL2, and then may apply a third sensing signal SS3 of the gate-on voltage Von to a third sensing signal line SSL3.

In contrast, the scan signal driving unit 200 may apply the scan signal to at least one scan signal line SCL and apply the sensing signal to at least one sensing signal line SSL during the vertical blank period VB. For example, as shown in FIGS. 5 and 7, during the vertical blank period VB of the Nth frame period, the scan signal driving unit 200 may apply the first scan signal SC1 of the gate-on voltage Von to the first scan signal line SCL1 and may not apply the scan signal of the gate-on voltage Von to the second to nth scan signal lines SCL2 to SCLn. That is, a first gate-off voltage Voff1 may be applied to the second to nth scan signal lines SCL2 to SCLn. Further, as shown in FIG. 5, during the vertical blank period VB of the (N+1)th frame period, the scan signal driving unit 200 may apply the first scan signal SC1 of the gate-on voltage Von to the second scan signal line SCL2 and may not apply the scan signal of the gate-on voltage Von to the first scan signal line SCL1 and the third to nth scan signal lines SCL3 to SCLn. That is, the first gate-off voltage Voff1 may be applied to the first scan signal line SCL1 and the third to nth scan signal lines SCL3 to SCLn.

As shown in FIGS. 5 to 7, a pulse width PW1 of the scan signal during the active period ACT is different from a pulse width PW3 of the scan signal during the vertical blank period VB. The pulse width of the scan signal indicates the length of the period in which the scan signal is outputted as the gate-on voltage. Further, a pulse width PW2 of the sensing signal during the active period ACT is different from a pulse width PW4 of the sensing signal during the vertical blank period VB. The pulse width of the sensing signal indicates the length of the period in which the sensing signal is outputted as the gate-on voltage.

In the following description, the scan signal driving unit 200 capable of outputting a kth (k being an integer satisfying 1≤k≤n) scan signal and a kth sensing signal simultaneously to reduce the area of the scan signal driving unit 200 and outputting different scan signals and different sensing signals in the active period ACT and the vertical blank period VB will be described in detail in conjunction with FIGS. 8 and 9.

Figure 8:
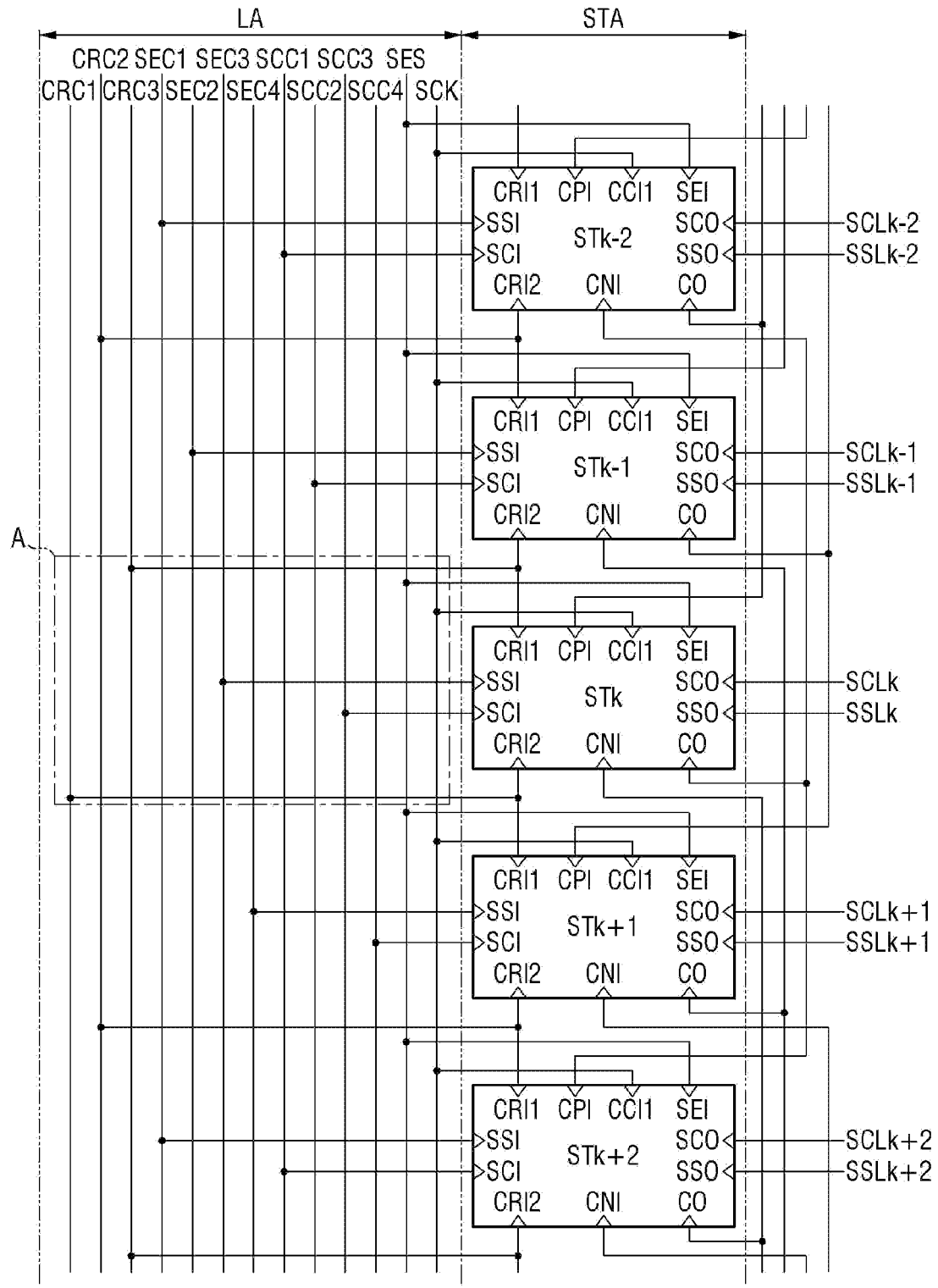
FIG. 8 illustrates an example of a scan signal driving unit according to one embodiment.

FIG. 8 illustrates an example of a scan signal driving unit according to one embodiment. For simplicity of description, FIG. 8 illustrates only (k−2)th to (k+2)th stages STk−2 to STk+2.

In the following description, "front stage" indicates a stage located in front of a reference stage. The "rear stage" indicates a stage located behind the reference stage. For example, the front stages of the kth stage STk indicate first to (k−1)th stages ST1 to STk−1, and the rear stages of the kth stage STk indicate (k+1)th to nth stages STk+1 to STn.

Referring to FIG. 8, the scan signal driving unit 200 includes a stage area STA in which the plurality of stages STk−2 to STk+2 are disposed and a line area LA in which a plurality of lines connected to the plurality of stages STk−2 to STk+2 to apply signals to the plurality of stages STk−2 to STk+2 are disposed. In the line area LA, carry clock lines CRC1 to CRC3 to which carry clock signals of which phases are sequentially delayed are applied, sensing clock lines SEC1 to SEC4 to which sensing clock signals whose phases are sequentially delayed are applied, scan clock lines SCC1 to SCC4 to which scan clock signals whose phases are sequentially delayed are applied, a sensing control line SES to which the sensing control signal is applied, and a control clock line SCK to which the control clock signal is applied may be disposed. The carry clock lines CRC1 to CRC3, the sensing clock lines SEC1 to SEC4, the scan clock lines SCC1 to SCC4, the sensing control line SES, and the control clock line SCK may be defined as the scan control lines to which the scan control signal SCS described in conjunction with FIG. 3 is applied.

Although FIG. 8 illustrates three carry clock lines CRC1 to CRC3, four sensing clock lines SEC1 to SEC4, and four scan clock lines SCC1 to SCC4, the number of the carry clock lines CRC1 to CRC3, the number of sensing clock lines SEC1 to SEC4, and the number of scan clock lines SCC1 to SCC4 are not limited thereto.

The scan signal driving unit 200 includes the plurality of stages STk−2 to STk+2 respectively connected to scan signal lines SCLk−2 to SCLk+2 and sensing signal lines SSLk−2 to SSLk+2. A (k−2)th stage STk−2 outputs a (k−2)th scan signal to a (k−2)th scan signal line SCLk−2 and outputs a (k−2)th sensing signal to a (k−2)th sensing signal line SSLk−2. A (k−1)th stage STk−1 outputs a (k−1)th scan signal to a (k−1)th scan signal line SCLk−1 and outputs a (k−1)th sensing signal to a (k−1)th sensing signal line SSLk−1. A kth stage STk outputs a kth scan signal to a kth scan signal line SCLk and outputs a kth sensing signal to a kth sensing signal line SSLk. A (k+1)th stage STk+1 outputs a (k+1)th scan signal to a (k+1)th scan signal line SCLk+1 and outputs a (k+1)th sensing signal to a (k+1)th sensing signal line SSLk+1. A (k+2)th stage STk+2 outputs a (k+2)th scan signal to a (k+2)th scan signal line SCLk+2 and outputs a (k+2)th sensing signal to a (k+2)th sensing signal line SSLk+2.

Each of the stages STk–2 to STk+2 includes a start terminal CPI, a rear carry terminal CNI, a scan clock terminal SCI, a sensing clock terminal SSI, a first carry clock terminal CRI1, a second carry clock terminal CRI2, a sensing control terminal SEI, a first control clock terminal SCI1, a carry output terminal CO, a scan output terminal SCO, and a sensing output terminal SSO.

The start terminal CPI may be connected to a start signal line or the carry output terminal CO of the front stage. For example, as shown in FIG. 8, the start terminal CPI of the kth stage STk may be connected to the start signal line or the carry output terminal CO of the (k–2)th stage STk–2. In this case, the start signal of the start signal line or a (k–2)th carry signal of the (k–2)th stage STk–2 may be inputted to the start terminal CPI of the kth stage STk.

The rear carry terminal CNI of each of the stages STk–2 to STk+2 may be connected to the carry output terminal CO of the rear stage. For example, as shown in FIG. 8, the rear carry terminal CNI of the kth stage STk may be connected to the carry output terminal CO of the (k+2)th stage STk+3. In this case, a (k+2)th carry signal of the (k+2)th stage STk+2 may be inputted to the rear carry terminal CNI of the kth stage STk.

The scan clock terminal SCI of each of the stages STk–2 to STk+2 may be connected to any one of the scan clock lines SCC1 to SCC4. The scan clock lines SCC1 to SCC4 may be sequentially connected to the scan clock terminals SCI of the stages STk–2 to STk+2. For example, as shown in FIG. 8, a first scan clock line SCC1 may be connected to the scan clock terminal SCI of the (k–2)th stage STk–2, and a second scan clock line SCC2 may be connected to the scan clock terminal SCI of the (k–1)th stage STk–1. A third scan clock line SCC3 may be connected to the scan clock terminal SCI of the kth stage STk, a fourth scan clock line SCC4 may be connected to the scan clock terminal SCI of the (k+1)th stage STk+1, and the first scan clock line SCC1 may be connected to the scan clock terminal SCI of the (k+2)th stage STk+2.

The sensing clock terminal SSI of each of the stages STk–2 to STk+2 may be connected to any one of the sensing clock lines SSC1 to SSC4. The sensing clock lines SSC1 to SSC4 may be sequentially connected to the sensing clock terminals SSI of the stages STk–2 to STk+2. For example, as shown in FIG. 8, the first sensing clock line SSC1 may be connected to the sensing clock terminal SSI of the (k–2)th stage STk–2, and the second sensing clock line SSC2 may be connected to the sensing clock terminal SSI of the (k–1)th stage STk–1. The third sensing clock line SSC3 may be connected to the sensing clock terminal SSI of the kth stage STk, the fourth sensing clock line SSC4 may be connected to the sensing clock terminal SSI of the (k+1)th stage STk+1, and the first sensing clock line SSC1 may be connected to the sensing clock terminal SSI of the (k+2)th stage STk+2.

Each of the first carry clock terminal CRI1 and the second carry clock terminal CRI2 of each of the stages STk–2 to STk+2 may be connected to any one of the carry clock lines CRC1 to CRC3. The carry clock lines CRC1 to CRC3 may be sequentially connected to the first carry clock terminals CRI1 and the second carry clock terminals CRI2 of the stages STk–2 to STk+2. For example, as shown in FIG. 8, the first carry clock line CRC1 may be connected to the first carry clock terminal CRI1 of the (k–2)th stage STk–2, and the second carry clock terminal CRI2 may be connected to the second carry clock terminal CRI2. The second carry clock line CRC2 may be connected to the first carry clock terminal CRI1 of the (k–1)th stage STk–1, and the third carry clock line CRC3 may be connected to the second carry clock terminal CRI2. The third carry clock line CRC3 may be connected to the first carry clock terminal CRI1 of the kth stage STk, and the first carry clock line CRC1 may be connected to the second carry clock terminal CRI2. The first carry clock line CRC1 may be connected to the first carry clock terminal CRI1 of the (k+1)th stage STk+1, and the second carry clock line CRC2 may be connected to the second carry clock terminal CRI2. The second carry clock line CRC2 may be connected to the first carry clock terminal CRI1 of the (k+2)th stage STk+2, and the third carry clock line CRC3 may be connected to the second carry clock terminal CRI2.

The sensing control terminal SEI of each of the stages STk–2 to STk+2 may be connected to the sensing control line SES. The sensing control signal may be inputted to the sensing control terminal SEI of each of the stages STk–2 to STk+2.

The first control clock terminal SCI of each of the stages STk–2 to STk+2 may be connected to the first control clock line SCK1. A first control clock signal may be inputted to the first control clock terminal SCI of each of the stages STk–2 to STk+2.

The carry output terminal CO of each of the stages STk–2 to STk+2 outputs a carry signal. The carry output terminal CO of each of the stages STk–2 to STk+2 may be connected to the rear carry terminal CNI of the front stage and the start terminal CPI of the rear stage. For example, as shown in FIG. 8, the carry output terminal CO of the kth stage STk may be connected to the rear carry terminal CNI of the (k–2)th stage STk–2 and the start terminal CPI of the (k+2)th stage STk+2.

The scan output terminal SCO of each of the stages STk–2 to STk+2 is connected to the scan signal line to output the scan signal. For example, as shown in FIG. 8, the scan output terminal SCO of the (k–2)th stage STk–2 may be connected to the (k–2)th scan signal line SCLk–2 to output the (k–2)th scan signal, and the scan output terminal SCO of the (k–1)th stage STk–1 may be connected to the (k–1)th scan signal line SCLk–1 to output the (k–1)th scan signal. The scan output terminal SCO of the kth stage STk may be connected to the kth scan signal line SCLk to output the kth scan signal, and the scan output terminal SCO of the (k+1)th stage STk+1 may be connected to the (k+1)th scan signal line SCLk+1 to output the (k+1)th scan signal. The scan output terminal SCO of the (k+2)th stage STk+2 may be connected to the (k+2)th scan signal line SCLk+2 to output the (k+2)th scan signal.

The sensing output terminal SSO of each of the stages STk–2 to STk+2 is connected to the sensing signal line to output the sensing signal. For example, as shown in FIG. 8, the sensing output terminal SSO of the (k–2)th stage STk–2 may be connected to the (k–2)th sensing signal line SSLk–2 to output the (k–2)th sensing signal, and the sensing output terminal SSO of the (k–1)th stage STk–1 may be connected to the (k–1)th sensing signal line SSLk–1 to output the (k–1)th sensing signal. The sensing output terminal SSO of the kth stage STk may be connected to the kth sensing signal line SSLk to output the kth sensing signal, and the sensing output terminal SSO of the (k+1)th stage STk+1 may be connected to the (k+1)th sensing signal line SSLk+1 to output the (k+1)th sensing signal. The sensing output terminal SSO of the (k+2)th stage STk+2 may be connected to the (k+2)th sensing signal line SSLk+2 to output the (k+2)th sensing signal.

As shown in FIG. 8, since the scan signal driving unit 200 includes only one stage for outputting the scan signal and the sensing signal simultaneously, it is possible to reduce the area of the scan signal driving unit 200 compared to the case where the stage for outputting the scan signal and the stage for outputting the sensing signal are separately provided.

Figure 9:
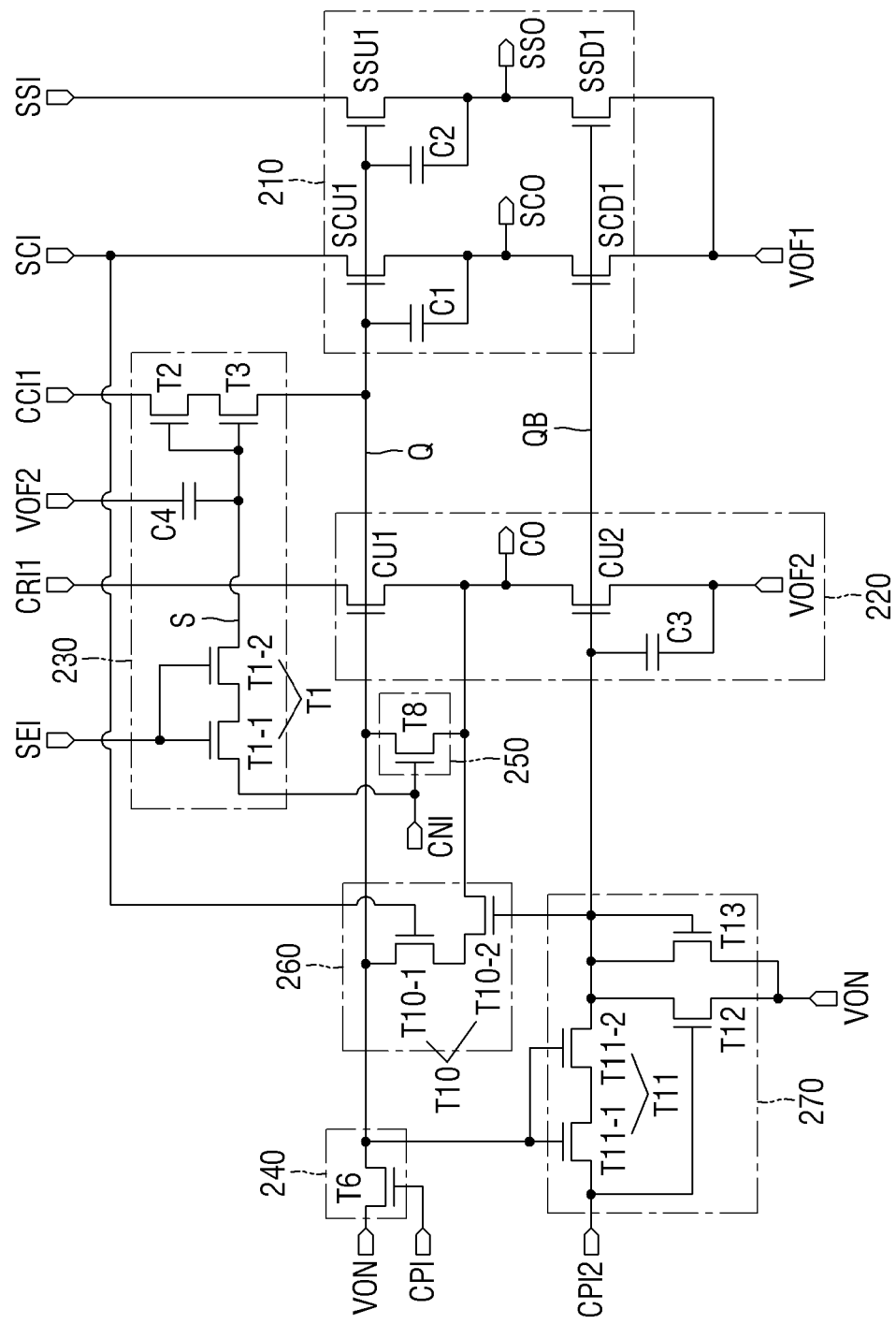
FIG. 9 is a circuit diagram illustrating the kth stage of a scan signal driving unit according to one embodiment.

FIG. 9 is a circuit diagram illustrating the kth stage of a scan signal driving unit according to one embodiment.

Referring to FIG. 9, the kth stage STk includes a first output unit 210, a second output unit 220, a sensing controller 230, a first pull-up node controller 240, a second pull-up node controller 250, a third pull-up node controller 260, and an inverter unit 270. The kth stage STk may further include the start terminal CPI, the rear carry terminal CNI, the first carry clock terminal CRI1, the second carry clock terminal CRI2, the sensing control terminal SEI, the first control clock terminal SCI1, the carry output terminal CO, the scan output terminal SCO, and the sensing output terminal SSO. The kth stage STk may further include a first gate-off terminal VOF1, a second gate-off terminal VOF2, and a gate-on terminal VON. The gate-on voltage may be applied to the gate-on terminal VON, the first gate-off voltage may be applied to the first gate-off terminal VOF1, and a second gate-off voltage may be applied to the second gate-off terminal VOF2. The gate-on voltage may be higher than 0V, and the first gate-off voltage and the second gate-off voltage may be lower than or equal to 0V. The first gate-off voltage may be higher than the second gate-off voltage.

FIG. 9 mainly describes the case where the third carry clock signal of the third carry clock line CRC3 is applied to the first carry clock terminal CRI1, the first carry clock signal of the first carry clock line CRC1 is applied to the second carry clock terminal CRI2, the third scan clock signal of the third scan clock line SCC3 is applied to the scan clock terminal SCI, and the third sensing clock signal of the third sensing clock line SEC3 is applied to the sensing clock terminal SSI. Further, FIG. 9 mainly describes the case where the carry signal of the (k−2)th stage STk−2 is applied to the start terminal CPI, and the carry signal of the (k+2)th stage STk+2 is applied to the rear carry terminal CNI.

FIG. 9 illustrates that a first scan pull-up transistor SCU1, a first scan pull-down transistor SCD1, a first sensing pull-up transistor SSU1, a first sensing pull-down transistor SSD1, first to fifth transistors T1 to T5, an eighth transistor T8, a tenth transistor T10, and twelfth to fifteenth transistors T12 to T15 are formed as an N-type metal oxide semiconductor field effect transistor (MOSFET). In this case, the first scan pull-up transistor SCU1, the first pull-down transistor SCD1, the first sensing pull-up transistor SSU1, the first sensing pull-down transistor SSD1, the first to fifth transistors T1 to T5, the eighth transistor T8, the tenth transistor T10, and the twelfth to fifteenth transistors T12 to T15 are turned on when a gate high voltage is applied. Therefore, the gate-on voltage may be a gate high voltage, the first gate-off voltage may be a first gate low voltage, and the second gate-off voltage may be a second gate low voltage.

When a pull-up node Q has the gate-on voltage, the first output unit 210 outputs the third scan clock signal inputted to the scan clock terminal SCI to the scan output terminal SCO, and outputs the third sensing clock signal inputted to the sensing clock terminal SSI to the sensing output terminal SSO. When a pull-down node QB has the gate-on voltage, the first output unit 210 outputs the first gate-off voltage to the scan output terminal SCO and the sensing output terminal SSO.

The first output unit 210 may include the first scan pull-up transistor SCU1, the first scan pull-down transistor SCD1, the first sensing pull-up transistor SSU1, the first sensing pull-down transistor SSD1, a first capacitor C1, and a second capacitor C2.

The first scan pull-up transistor SCU1 is turned on by the gate-on voltage of the pull-up node Q to output the third scan clock signal inputted to the scan clock terminal SCI to the scan output terminal SCO. The gate electrode of the first scan pull-up transistor SCU1 may be connected to the pull-up node Q, the first electrode thereof may be connected to the scan output terminal SCO, and the second electrode thereof may be connected to the scan clock terminal SCI.

In order to increase the amount of current flowing through a channel when the first scan pull-up transistor SCU1 is turned on, the first scan pull-up transistor SCU1 may further include the second gate electrode electrically connected to the pull-up node Q. In this case, the first scan pull-up transistor SCU1 may be formed in a double gate structure including the gate electrode corresponding to an upper gate electrode and the second gate electrode corresponding to a lower gate electrode.

The first scan pull-down transistor SCD1 is turned on by the gate-on voltage of the pull-down node QB to output the first gate-off voltage inputted to the first gate-off terminal VOF1 to the scan output terminal SCO. The gate electrode of the first scan pull-down transistor SCD1 may be connected to the pull-down node QB, the first electrode thereof may be connected to the first gate-off terminal VOF1, and the second electrode thereof may be connected to the scan output terminal SCO.

In order to prevent or reduce leakage current flowing through the first scan pull-down transistor SCD1, the first scan pull-down transistor SCD1 may further include the second gate electrode connected to the pull-down node QB. In this case, the first scan pull-down transistor SCD1 may be formed in a double gate structure including the gate electrode corresponding to an upper gate electrode and the second gate electrode corresponding to a lower gate electrode.

In order to increase the amount of current flowing through a channel when the first sensing pull-up transistor SSU1 is turned on, the first sensing pull-up transistor SSU1 is turned on by the gate-on voltage of the pull-up node Q to output the third sensing clock signal inputted to the sensing clock terminal SSI to the sensing output terminal SSO. The gate electrode of the first sensing pull-up transistor SSU1 may be connected to the pull-up node Q, the first electrode thereof may be connected to the sensing output terminal SSO, and the second electrode thereof may be connected to the sensing clock terminal SSI.

The first sensing pull-up transistor SSU1 may further include the second gate electrode electrically connected to the pull-up node Q. In this case, the first sensing pull-up transistor SSU1 may be formed in a double gate structure including the gate electrode corresponding to an upper gate electrode and the second gate electrode corresponding to a lower gate electrode.

The first sensing pull-down transistor SSD1 is turned on by the gate-on voltage of the pull-down node QB to output the first gate-off voltage inputted to the first gate-off terminal VOF1 to the sensing output terminal SSO. The gate electrode of the first sensing pull-down transistor SSD1 may be connected to the pull-down node QB, the first electrode thereof may be connected to the first gate-off terminal VOF1, and the second electrode thereof may be connected to the sensing output terminal SSO.

In order to prevent or reduce leakage current flowing through the first sensing pull-down transistor SSD1, the first sensing pull-down transistor SSD1 may further include the second gate electrode connected to the pull-down node QB. In this case, the first sensing pull-down transistor SSD1 may be formed in a double gate structure including the gate electrode corresponding to an upper gate electrode and the second gate electrode corresponding to a lower gate electrode.

The first capacitor C1 is disposed between the pull-up node Q and the scan output terminal SCO. One electrode of the first capacitor C1 may be connected to the pull-up node Q, and the other electrode may be connected to the scan output terminal SCO. Since the first capacitor C1 stores the voltage difference between the pull-up node Q and the scan output terminal SCO, the voltage difference between the pull-up node Q and the scan output terminal SCO may be maintained at a constant level by the first capacitor C1.

The second capacitor C2 is disposed between the pull-up node Q and the sensing output terminal SSO. One electrode of the second capacitor C2 may be connected to the pull-up node Q, and the other electrode may be connected to the sensing output terminal SSO. Since the second capacitor C2 stores the voltage difference between the pull-up node Q and the sensing output terminal SSO, the voltage difference between the pull-up node Q and the sensing output terminal SSO may be maintained at a constant level by the second capacitor C2.

When the pull-up node Q has the gate-on voltage, the second output unit 220 outputs the third carry clock signal inputted to the first carry clock terminal CRI1 to the carry output terminal CO. When the pull-down node QB has the gate-on voltage, the second output unit 220 outputs the first gate-off voltage to the carry output terminal CO.

The second output unit 220 may include a carry pull-up transistor CU1, a carry pull-down transistor CU2, and a third capacitor C3.

The carry pull-up transistor CU1 is turned on by the gate-on voltage of the pull-up node Q to output the third carry clock signal inputted to the first carry clock terminal CRI1 to the carry output terminal CO. The gate electrode of the carry pull-up transistor CU1 may be connected to the pull-up node Q, the first electrode thereof may be connected to the carry output terminal CO, and the second electrode thereof may be connected to the first carry clock terminal CRI1.

The carry pull-down transistor CU2 is turned on by the gate-on voltage of the pull-down node QB to output the first gate-off voltage inputted to the second gate-off terminal VOF2 to the carry output terminal CO. The gate electrode of the carry pull-down transistor CU2 may be connected to the pull-down node QB, the first electrode thereof may be connected to the second gate-off terminal VOF2, and the second electrode thereof may be connected to the carry output terminal CO.

The third capacitor C3 is disposed between the pull-down node QB and the first gate-off terminal VOF1. One electrode of the third capacitor C3 may be connected to the pull-down node QB, and the other electrode may be connected to the first gate-off terminal VOF1. Since the third capacitor C3 stores the voltage difference between the pull-down node QB and the first gate-off terminal VOF1, the voltage difference between the pull-down node QB and the first gate-off terminal VOF1 may be maintained at a constant level by the third capacitor C3.

When the sensing control signal of the gate-on voltage is inputted to the sensing control terminal SEI during the active period of the Nth frame period, the sensing controller 230 applies the gate-on voltage to the pull-up node during the vertical blank period of the Nth frame period. Accordingly, the first scan pull-up transistor SCU1 and the first sensing pull-up transistor SCD1 are turned on during the vertical blank period of the Nth frame period, so that the first output unit 210 may output the third scan clock signal inputted to the scan clock terminal SCI to the scan output terminal SCO, and may output the third sensing clock signal inputted to the sensing clock terminal SSI to the sensing output terminal SSO.

The sensing controller 230 may include a first transistor T1, a second transistor T2, a third transistor T3, and a fourth capacitor C4.

The first transistor T1 is turned on by the gate-on voltage of the sensing control signal inputted to the sensing control terminal SEI to apply the carry signal of the (k+2)th stage STk+2 that is inputted to the rear carry terminal CNI to a sensing control node S. That is, when the carry signal of the (k+2)th stage STk+2 of the gate-on voltage is inputted during the period in which the first transistor T1 is turned on, the sensing control node S has the gate-on voltage.

The first transistor T1 may include a (1-1)-th transistor T1-1 and a (1-2)-th transistor T1-2.

The (1-1)-th transistor T1-1 is turned on by the gate-on voltage of the sensing control signal inputted to the sensing control terminal SEI to connect the rear carry terminal CNI and the second electrode of the (1-2)-th transistor T1-2. The gate electrode of the (1-1)-th transistor T1-1 may be connected to the sensing control terminal SEI, the first electrode thereof may be connected to the second electrode of the (1-2)-th transistor T1-2, and the second electrode thereof may be connected to the rear carry terminal CNI.

The (1-2)-th transistor T1-2 is turned on by the gate-on voltage of the sensing control signal inputted to the sensing control terminal SEI to connect the sensing control node S and the first electrode of the (1-1)-th transistor T1-1. The gate electrode of the (1-2)-th transistor T1-2 may be connected to the sensing control terminal SEI, the first electrode thereof may be connected to the sensing control node S, and the second electrode thereof may be connected to the first electrode of the (1-1)-th transistor T1-1.

The second transistor T2 and the third transistor T3 are turned on by the gate-on voltage of the sensing control node S to apply the first control clock signal inputted to the first control clock terminal CCI1 to the pull-up node Q. That is, the second transistor T2 and the third transistor T3 are turned on by the gate-on voltage of the sensing control node S to connect the first control clock terminal CC1 and the pull-up node Q. The gate electrode of the second transistor T2 may be connected to the sensing control node S, the first electrode thereof may be connected to the second electrode of the third transistor T3, and the second electrode thereof may be connected to the first control clock terminal CCI1. The gate electrode of the third transistor T3 may be connected to the sensing control node S, the first electrode thereof may be connected to the pull-up node Q, and the second electrode thereof may be connected to the first electrode of the second transistor T2.

The fourth capacitor C4 is disposed between the sensing control node S and the second gate-off terminal VOF2. One electrode of the fourth capacitor C4 may be connected to the sensing control node S, and the other electrode may be connected to the second gate-off terminal VOF2. Since the fourth capacitor C4 stores the voltage difference between the sensing control node S and the second gate-off terminal VOF2, the voltage difference between the sensing control node S and the second gate-off terminal VOF2 may be maintained at a constant level by the fourth capacitor C4.

When the carry signal of the (k−2)th stage STk−2 that is applied to the start terminal CPI has the gate-on voltage, the first pull-up node controller 240 applies the gate-on voltage to the pull-up node Q. The first pull-up node controller 240 may include a sixth transistor T6.

The sixth transistor T6 is turned on by the carry signal of the (k−2)th stage STk−2 of the gate-on voltage to connect the pull-up node Q to the gate-on terminal VON, so that the gate-on voltage may be applied to the pull-up node Q. The gate electrode of the sixth transistor T6 may be connected to the start terminal CPI, the first electrode thereof may be connected to the pull-up node Q, and the second electrode thereof may be connected to the gate-on terminal VON.

When the carry signal of the (k+2)th stage STk+2 that is inputted to the rear carry terminal CNI has the gate-on voltage, the second pull-up node controller 250 applies the second gate-off voltage to the pull-up node Q. The second pull-up node controller 250 may include the eighth transistor T8.

The eighth transistor T8 is turned on by the carry signal of the (k+2)th stage STk+2 of the gate-on voltage to connect the pull-up node Q to the carry output terminal CO, so that the second gate-off voltage may be applied to the pull-up node Q. The gate electrode of the eighth transistor T8 may be connected to the rear carry terminal CNI, the first electrode thereof may be connected to the carry output terminal CO, and the second electrode thereof may be connected to the pull-up node Q. The channel width of a thirteenth transistor T13 may be greater than the channel width of an eleventh transistor T11.

When the third scan clock signal inputted to the scan clock terminal SCI or the third sensing clock signal inputted to the sensing clock terminal SSI has the gate-on voltage, and the pull-down node QB has the gate-on voltage, the third pull-up node controller 260 applies the second gate-off voltage to the pull-up node Q. The third pull-up node controller 260 may include the tenth transistor T10. The tenth transistor T10 may include a tenth-first transistor T10-1 and a tenth-second transistor T10-2.

The tenth-first transistor T10-1 may be turned on by the third scan clock signal or the third sensing clock signal of the gate-on voltage to connect the pull-up node Q to the second electrode of the tenth-second transistor T10-2. The gate electrode of the tenth-first transistor T10-1 may be connected to the scan clock terminal SCI or the sensing clock terminal SSI, the first electrode thereof may be connected to the second electrode of the tenth-second transistor T10-2, and the second electrode thereof may be connected to the pull-up node Q.

The tenth-second transistor T10-2 may be turned on by the gate-on voltage of the pull-down node QB to connect the carry output terminal CO to the first electrode of the tenth-first transistor T10-1. The gate electrode of the tenth-second transistor T10-2 may be connected to the pull-down node QB, the first electrode thereof may be connected to the carry output terminal CO, and the second electrode thereof may be connected to the first electrode of the tenth-first transistor T10.

When the pull-up node Q has the gate-on voltage, the inverter unit 270 applies the first gate-off voltage to the pull-down node QB. Further, when the pull-up node Q has the second gate-off voltage, the inverter unit 270 may apply the gate-on voltage to the pull-down node QB.

The inverter unit 270 may include the eleventh transistor T11, the twelfth transistor T12, and the thirteenth transistor T13.

The eleventh transistor T11 is turned on by the gate-on voltage of the pull-up node Q to apply the first carry clock signal of the second carry clock terminal CRI2 to the pull-down node QB. The carry clock signal inputted to the second carry clock terminal CRI2 may have the first gate-off voltage during the period in which the pull-up node Q has the voltage higher than or equal to the gate-on voltage. The eleventh transistor T11 may include an eleventh-first transistor T11-1 and an eleventh-second transistor T11-2.

The eleventh-first transistor T11-1 may be turned on by the gate-on voltage of the pull-up node Q to connect the second carry clock terminal CRI2 to the second electrode of the eleventh-second transistor T11-2. The gate electrode of the eleventh-first transistor T11-1 may be connected to the pull-up node Q, the first electrode thereof may be connected to the second electrode of the eleventh-second transistor T11-2, and the second electrode thereof may be connected to the second carry clock terminal CRI2.

The eleventh-second transistor T11-2 may be turned on by the gate-on voltage of the pull-up node Q to connect the pull-down node QB to the first electrode of the eleventh-first transistor T11-1. The gate electrode of the eleventh-second transistor T11-2 may be connected to the pull-up node Q, the first electrode thereof may be connected to the pull-down node QB, and the second electrode thereof may be connected to the first electrode of the eleventh-second transistor T11-2.

The twelfth transistor T12 may be turned on by the gate-on voltage of the first carry clock signal of the second carry output terminal CRI2 to connect the pull-down node QB to the gate-on terminal VON, so that the gate-on voltage may be applied to the pull-down node Q. The gate electrode of the twelfth transistor T12 may be connected to the second carry output terminal CRI2, the first electrode thereof may be connected to the pull-down node QB, and the second electrode thereof may be connected to the gate-on terminal VON.

The thirteenth transistor T13 may be turned on by the gate-on voltage of the pull-down node QB to connect the pull-down node QB to the gate-on terminal VON, so that the gate-on voltage may be applied to the pull-down node Q. The gate electrode and the first electrode of the thirteenth transistor T13 may be connected to the pull-down node QB, and the second electrode thereof may be connected to the gate-on terminal VON.

One of the first electrode and the second electrode of each of the first scan pull-up transistor SCU1, the first scan pull-down transistor SCD1, the first sensing pull-up transistor SSU1, the first sensing pull-down transistor SSD1, the first to fifth transistors T1 to T5, the eighth transistor T8, the tenth transistor T10, and the twelfth to fifteenth transistors T12 to T15 may be the source electrode, and the other may be the drain electrode.

Further, the semiconductor layer of each of the first scan pull-up transistor SCU1, the first scan pull-down transistor SCD1, the first sensing pull-up transistor SSU1, the first sensing pull-down transistor SSD1, the first to fifth transistors T1 to T5, the eighth transistor T8, the tenth transistor T10, and the twelfth to fifteenth transistors T12 to T15 may be made of amorphous silicon (a-Si), poly silicon (Poly-Si), or an oxide semiconductor.

Figure 10:
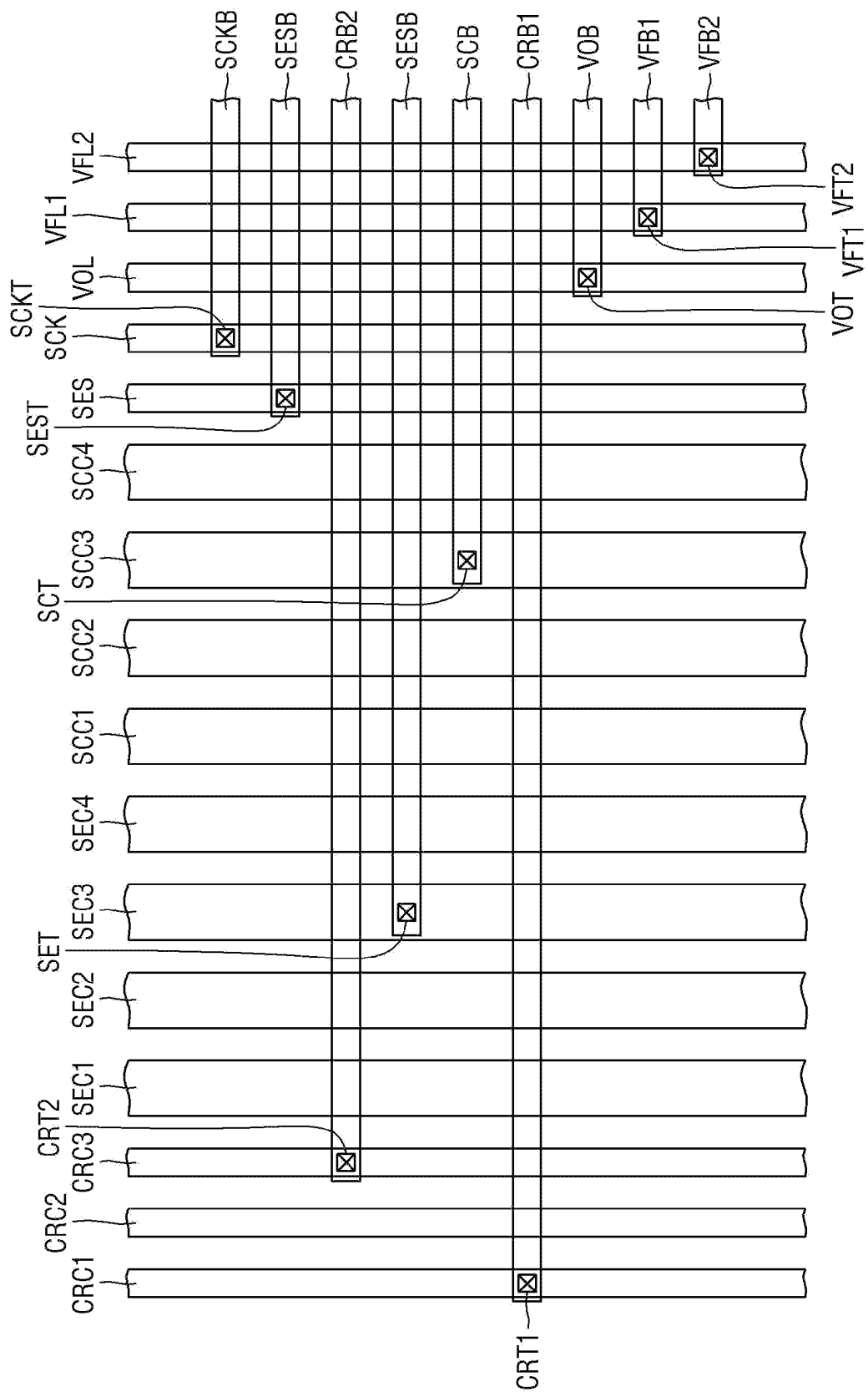
FIG. 10 is a plan view specifically illustrating an example of area A of FIG. 8.

FIG. 10 is a plan view specifically illustrating an example of area A of FIG. 8.

FIG. 10 shows a first carry connection line CRB1, a second carry connection line CRB2, a sensing connection line SEB, a scan connection line SCB, a sensing control connection line SEB, a control connection line SCKB, a gate-on connection line VOB, a first gate-off connection line VFB1, and a second gate-off connection line VFB2 that are connected to the kth stage STk in the line area LA of the scan signal driving unit 200. Further, FIG. 10 shows the carry clock lines CRC1 to CRC3, the sensing clock lines SEC1 to SEC4, the scan clock lines SCC1 to SCC4, the sensing control line SES, the control clock line SCK, the gate-on voltage line VOL, the first gate-off voltage line VOF1, and the second gate-off voltage line VOF2 in the line area LA of the scan signal driving unit 200.

As shown in FIG. 10, the carry clock lines CRC1 to CRC3 may be disposed to be farthest from the kth stage STk in one direction DR1, and the sensing clock lines SEC1 to SEC4 may be disposed to be second farthest from the kth stage STk. Further, the scan clock lines SCC1 to SCC4 may be disposed to be third farthest from the kth stage STk, and global signal lines such as the sensing control line SES, the control clock line SCK, the gate-on voltage line VOL, the first gate-off voltage line VOF1, and the second gate-off voltage line VOF2 may be disposed to be closest to the kth stage STk. The global signal lines indicate lines to which signals commonly applied to the plurality of stages STk–2 to STk are applied.

Meanwhile, in this specification, for simplicity of description, the carry clock lines CRC1 to CRC3 are defined as first clock lines, and the global signal lines such as the sensing control line SES, the control clock line SCK, the gate-on voltage line VOL, the first gate-off voltage line VOF1, and the second gate-off voltage line VOF2 are defined as second clock lines. Further, the scan clock lines SCC1 to SCC4 are defined as third clock lines, and the sensing clock lines SEC1 to SEC4 are defined as fourth clock lines.

Further, in this specification, for simplicity of description, the first carry connection line CRB1 and the second carry connection line CRB2 are defined as first connection lines, and the global connection lines such as the sensing control connection line SEB, the control connection line SCK, the gate-on connection line VOB, the first gate-off connection line VFB1, and the second gate-off connection line VFB2 are defined as second connection lines. Further, the scan connection line SCB is defined as a third connection line, and the sensing connection line SEB is defined as a fourth connection line.

Referring to FIG. 10, the carry clock lines CRC1 to CRC3, the sensing clock lines SEC1 to SEC4, the scan clock lines SCC1 to SCC4, the sensing control line SES, the control clock line SCK, the gate-on voltage line VOL, the first gate-off voltage line VOF1, and the second gate-off voltage line VOF2 may extend in one direction DR1. The first carry connection line CRB1, the second carry connection line CRB2, the sensing connection line SEB, the scan connection line SCB, the sensing control connection line SEB, the control connection line SCK, the gate-on connection line VOB, the first gate-off connection line VFB1, and the second gate-off connection line VFB2 may extend in the other direction DR2 intersecting one direction DR1.

Two of the carry clock lines CRC1 to CRC3 may be electrically connected to the kth stage STk. For example, as shown in FIG. 10, the first carry clock line CRC1 may be connected to the kth stage STk through the first carry connection line CRB1. The first carry clock line CRC1 may be connected to the first carry connection line CRB1 through a first carry contact hole CRT1. Further, the third carry clock line CRC3 may be connected to the kth stage STk through the second carry connection line CRB2. The third carry clock line CRC3 may be connected to the second carry connection line CRB2 through a second carry contact hole CRT2. The first carry connection line CRB1 and the second carry connection line CRB2 may intersect the sensing clock lines SEC1 to SEC4, the scan clock lines SCC1 to SCC4, the sensing control line SES, the control clock line SCK, the gate-on voltage line VOL, the first gate-off voltage line VOF1, and the second gate-off voltage line VOF2.

At least one of the sensing clock lines SEC1 to SEC4 may be electrically connected to the kth stage STk. For example, as shown in FIG. 10, the third sensing clock line SEC3 may be connected to the kth stage STk through the sensing connection line SEB. The third sensing clock line SEC3 may be connected to the sensing connection line SEB through a sensing contact hole SET. The sensing connection line SEB may intersect the scan clock lines SCC1 to SCC4, the sensing control line SES, the control clock line SCK, the gate-on voltage line VOL, the first gate-off voltage line VOF1, and the second gate-off voltage line VOF2.

At least one of the scan clock lines SCC1 to SCC4 may be electrically connected to the kth stage STk. For example, as shown in FIG. 10, the third scan clock line SCC3 may be connected to the kth stage STk through the scan connection line SCB. The third scan clock line SCC3 may be connected to the scan connection line SCB through a scan contact hole SCT. The scan connection line SCB may intersect the sensing control line SES, the control clock line SCK, the gate-on voltage line VOL, the first gate-off voltage line VOF1, and the second gate-off voltage line VOF2.

The sensing control line SES may be connected to the kth stage STk through the sensing control connection line SECB. The sensing control line SES may be connected to the sensing control connection line SECB through a sensing control contact hole SEST. The sensing control connection line SECB may intersect the control clock line SCK, the gate-on voltage line VOL, the first gate-off voltage line VOF1, and the second gate-off voltage line VOF2.

The control clock line SCK may be connected to the kth stage STk through the control connection line SCKB. The control clock line SCK may be connected to the control connection line SCKB through a control clock contact hole SCKT. The control connection line SCKB may intersect the gate-on voltage line VOL, the first gate-off voltage line VOF1, and the second gate-off voltage line VOF2.

The gate-on voltage line VOL may be connected to the kth stage STk through the gate-on connection line VOB. The gate-on voltage line VOL may be connected to the gate-on connection line VOB through an on contact hole VOT. The gate-on connection line VOB may intersect the first gate-off voltage line VOF1 and the second gate-off voltage line VOF2.

The first gate-off voltage line VOF1 may be connected to the kth stage STk through the first gate-off connection line VFB1. The first gate-off voltage line VOF1 may be connected to the first gate-off connection line VFB1 through a first off contact hole VFT1. The first gate-off connection line VFB1 may intersect the second gate-off voltage line VOF2.

The second gate-off voltage line VOF2 may be connected to the kth stage STk through the second gate-off connection line VFB2. The second gate-off voltage line VOF2 may be connected to the second gate-off connection line VFB2 through a second off contact hole VFT2.

Figure 11:
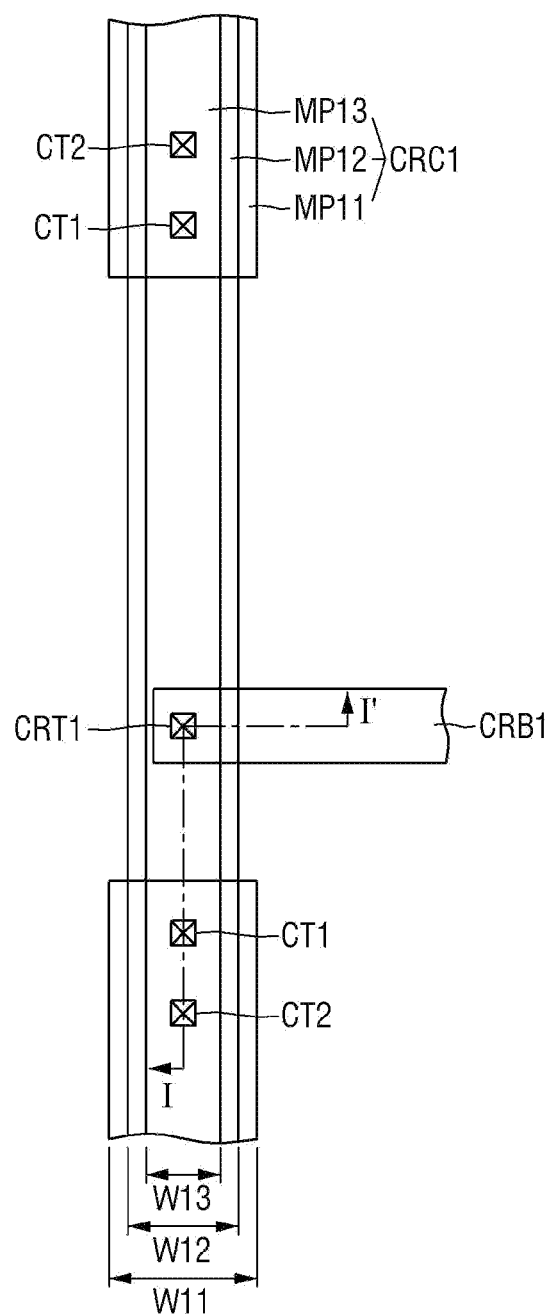
FIG. 11 is an enlarged plan view specifically illustrating the first carry clock line and the first carry connection line of FIG. 10.
Figure 12:
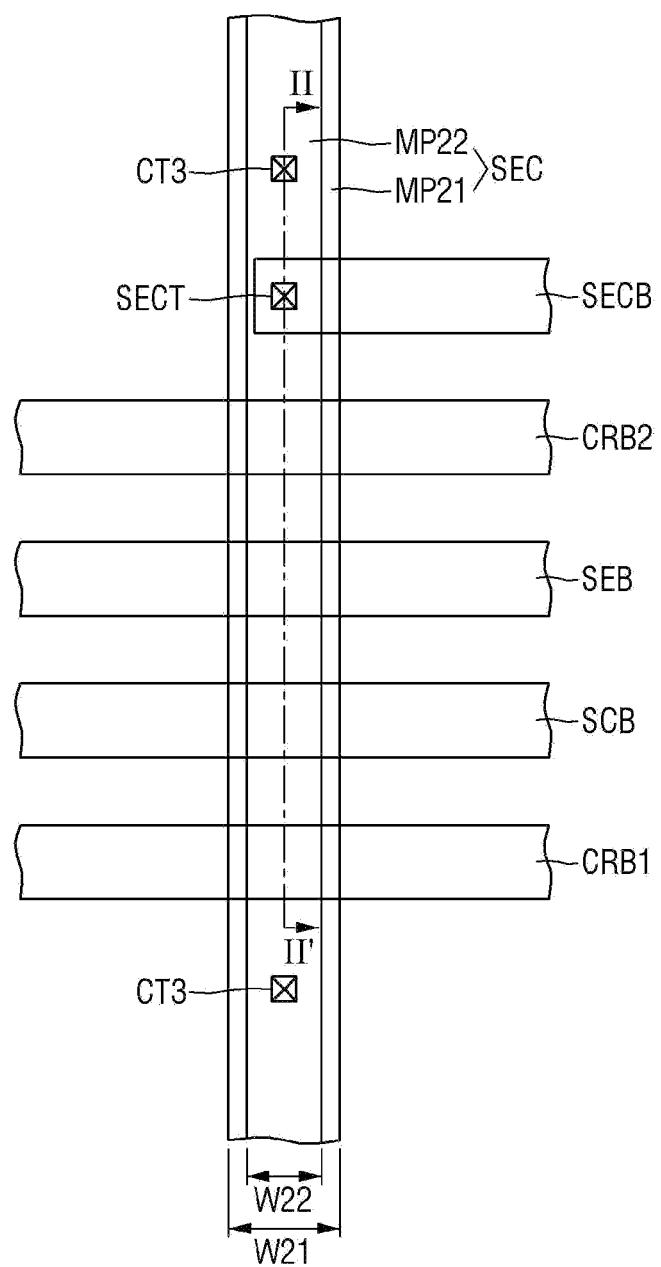
FIG. 12 is an enlarged plan view specifically illustrating the third sensing clock line and the sensing connection line of FIG. 10.
Figure 13:
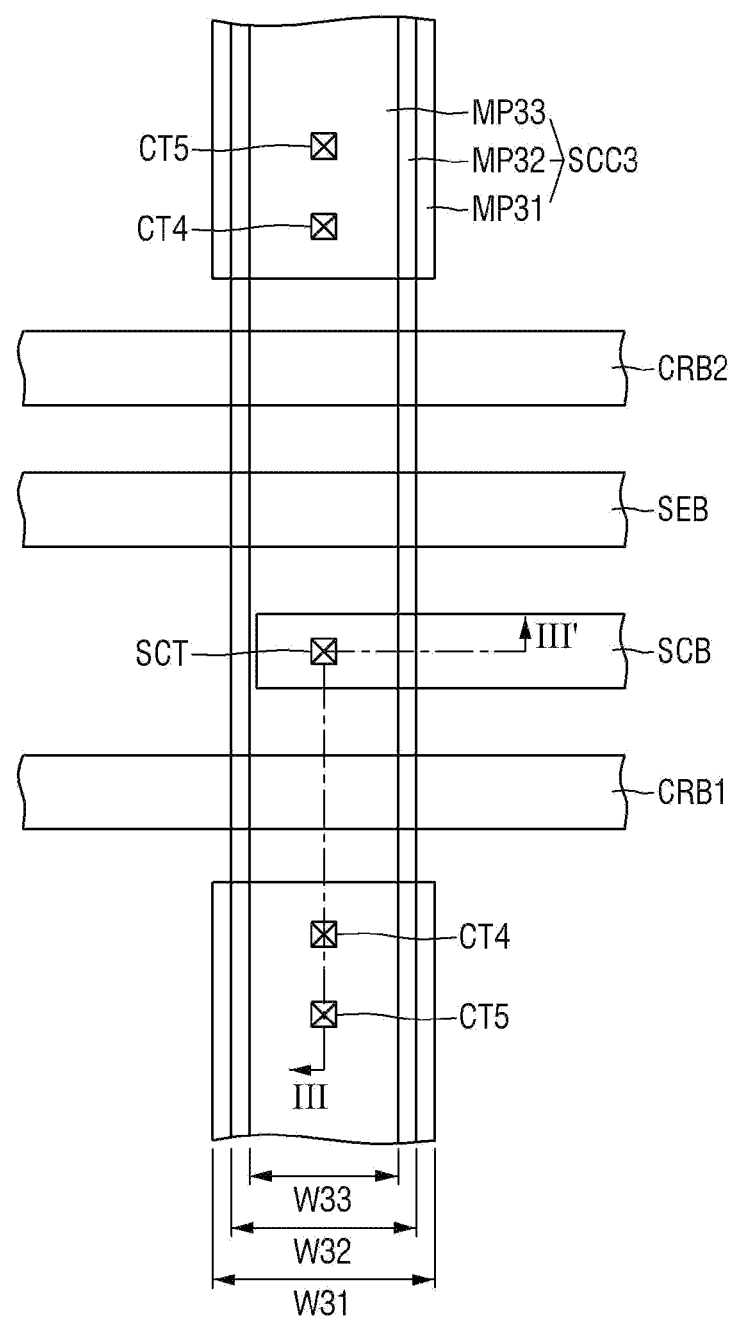
FIG. 13 is an enlarged plan view specifically illustrating the third scan clock line and the scan connection line of FIG. 10.
Figure 14:
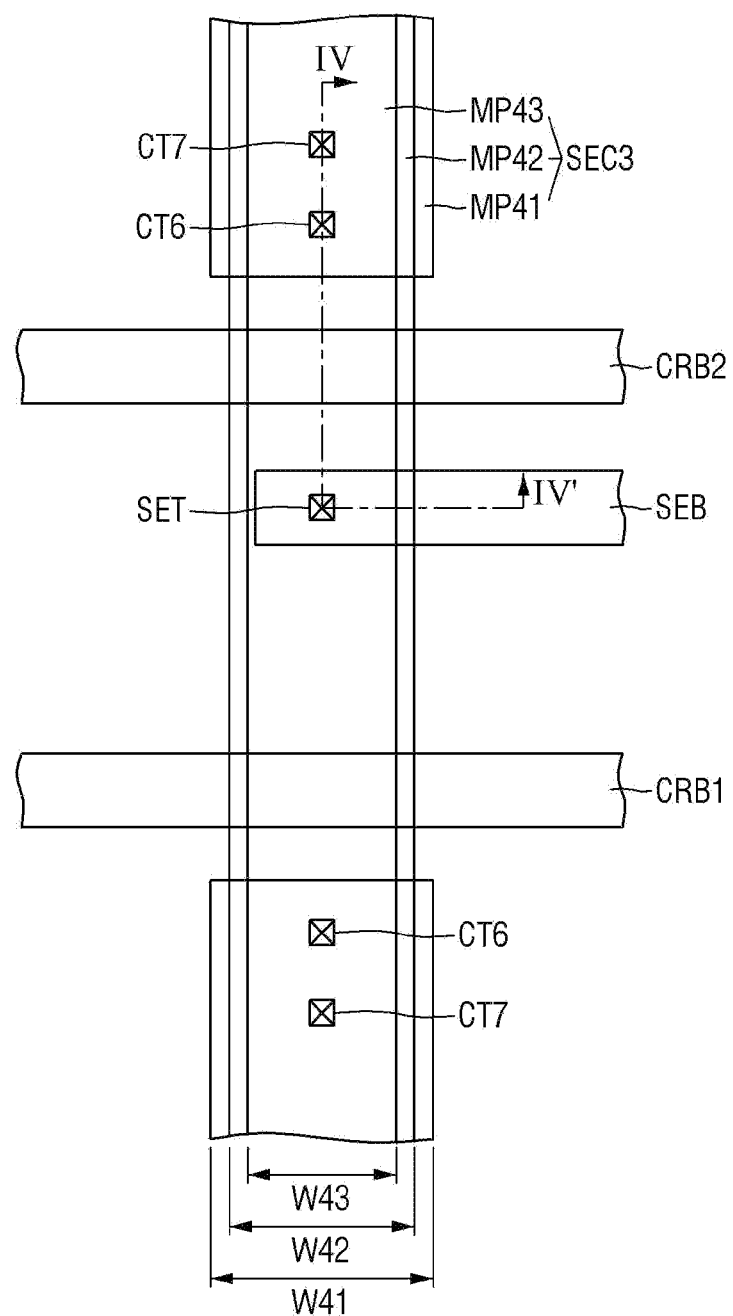
FIG. 14 is an enlarged plan view specifically illustrating the sensing control line and the sensing connection line of FIG. 10.

FIG. 11 is an enlarged plan view specifically illustrating the first carry clock line and the first carry connection line of FIG. 10. FIG. 12 is an enlarged plan view specifically illustrating the third sensing clock line and the sensing connection line of FIG. 10. FIG. 13 is an enlarged plan view specifically illustrating the third scan clock line and the scan connection line of FIG. 10. FIG. 14 is an enlarged plan view specifically illustrating the sensing control line and the sensing connection line of FIG. 10.

Referring to FIG. 11, the first carry clock line CRC1 may include a plurality of metal patterns. For example, the first carry clock line CRC1 may have a three-layer structure including a (1-1)-th metal pattern MP11, a (1-2)-th metal pattern MP12, and a (1-3)-th metal pattern MP13 overlapping each other.

The (1-2)-th metal pattern MP12 may be disposed on the (1-1)-th metal pattern MP11, and the (1-3)-th metal pattern MP13 may be disposed on the (1-2)-th metal pattern MP12. The (1-1)-th metal pattern MP11 may be connected to the (1-2)-th metal pattern MP12 through first contact holes CT1, and the (1-2)-th metal pattern MP12 may be connected to the (1-3)-th metal pattern MP13 through second contact holes CT2. The (1-2)-th metal pattern MP12 may be connected to the first carry connection line CRB1 through the first carry contact hole CRT1. The (1-1)-th metal pattern MP11 may not overlap the first carry connection line CRB1.

Although FIG. 11 illustrates that a width W11 of the (1-1)-th metal pattern MP11 is greater than a width W12 of the (1-2)-th metal pattern MP12, and the width W12 of the (1-2)-th metal pattern MP12 is greater than a width W13 of the (1-3)-th metal pattern MP13, the inventive concepts are not limited thereto. The width W11 of the (1-1)-th metal pattern MP11 may be substantially the same as the width W12 of the (1-2)-th metal pattern MP12, and the width W12 of the (1-2)-th metal pattern MP12 may be substantially the same as the width W13 of the (1-3)-th metal pattern MP13.

The third carry clock line CRC3 and the second carry connection line CRB2 illustrated in FIG. 10 may be substantially the same as the first carry clock line CRC1 and the first carry connection line CRB1 described in conjunction with FIG. 11.

Referring to FIG. 12, the sensing control line SEC may include a plurality of metal patterns. For example, the sensing control line SEC may have a two-layer structure including a (2-1)-th metal pattern MP21 and a (2-2)-th metal pattern MP22 overlapping each other.

The (2-2)-th metal pattern MP22 may be disposed on the (2-1)-th metal pattern MP21. The (2-1)-th metal pattern MP21 may be connected to the (2-2)-th metal pattern MP12 through third contact holes CT3. The (2-1)-th metal pattern MP21 may be connected to a sensing control connection line SECB through the sensing control contact hole SECT.

Although FIG. 12 illustrates that a width W21 of the (2-1)-th metal pattern MP21 is greater than a width W22 of the (2-2)-th metal pattern MP22, the inventive concepts are not limited thereto. The width W21 of the (2-1)-th metal pattern MP21 may be substantially the same as the width W22 of the (2-2)-th metal pattern MP22.

The control clock line SCK, the gate-on voltage line VOL, the first gate-off voltage line VOF1, and the second gate-off voltage line VOF2 illustrated in FIG. 10 may be substantially the same as the sensing control line SEC described in conjunction with FIG. 11. Further, the control clock line SCK, the gate-on voltage line VOL, the first gate-off voltage line VOF1, and the second gate-off voltage line VOF2 illustrated in FIG. 10 may be substantially the same as the sensing control connection line SECB described in conjunction with FIG. 11.

Referring to FIG. 13, the third scan clock line SCC3 may include a plurality of metal patterns. For example, the third scan clock line SCC3 may have a three-layer structure including a (3-1)-th metal pattern MP31, a (3-2)-th metal pattern MP32, and a (3-3)-th metal pattern MP33 overlapping each other.

The (3-2)-th metal pattern MP32 may be disposed on the (3-1)-th metal pattern MP31, and the (3-3)-th metal pattern MP33 may be disposed on the (3-2)-th metal pattern MP32. The (3-1)-th metal pattern MP31 may be connected to the (3-2)-th metal pattern MP32 through fourth contact holes CT4, and the (3-2)-th metal pattern MP32 may be connected to the (3-3)-th metal pattern MP33 through fifth contact holes CT5. The (3-2)-th metal pattern MP32 may be connected to the scan connection line SCB through the scan contact hole SCT. The (3-1)-th metal pattern MP31 may not overlap the scan connection line SCB.

Although FIG. 13 illustrates that a width W31 of the (3-1)-th metal pattern MP31 is wider than a width W32 of the (3-2)-th metal pattern MP32, and the width W32 of the (3-2)-th metal pattern MP32 is wider than a width W33 of the (3-3)-th metal pattern MP33, the inventive concepts are not limited thereto. The width W31 of the (3-1)-th metal pattern MP31 may be substantially the same as the width W32 of the (3-2)-th metal pattern MP32, and the width W32 of the (3-2)-th metal pattern MP32 may be substantially the same as the width W33 of the (3-3)-th metal pattern MP33.

Referring to FIG. 14, the third sensing clock line SEC3 may include a plurality of metal patterns. For example, the third sensing clock line SEC3 may have a three-layer structure including a (4-1)-th metal pattern MP41, a (4-2)-th metal pattern MP42, and a (4-3)-th metal pattern MP43 overlapping each other.

The (4-2)-th metal pattern MP42 may be disposed on the (4-1)-th metal pattern MP41, and the (4-3)-th metal pattern MP43 may be disposed on the (4-2)-th metal pattern MP42. The (4-1)-th metal pattern MP41 may be connected to the (4-2)-th metal pattern MP42 through sixth contact holes CT6, and the (4-2)-th metal pattern MP42 may be connected to the (4-3)-th metal pattern MP43 through seventh contact holes CT7. The (4-2)-th metal pattern MP42 may be connected to the sensing connection line SEB through the sensing contact hole SET. The (4-1)-th metal pattern MP41 may not overlap the scan connection line SCB.

Although FIG. 14 illustrates that a width W31 of the (3-1)-th metal pattern MP31 is wider than a width W32 of the (3-2)-th metal pattern MP32, and the width W32 of the (3-2)-th metal pattern MP32 is wider than a width W33 of the (3-3)-th metal pattern MP33, the inventive concepts are not limited thereto. The width W31 of the (3-1)-th metal pattern MP31 may be substantially the same as the width W32 of the (3-2)-th metal pattern MP32, and the width W32 of the (3-2)-th metal pattern MP32 may be substantially the same as the width W33 of the (3-3)-th metal pattern MP33.

In accordance with the embodiment of FIGS. 11 to 14, each of the carry clock lines CRC1 to CRC3, the sensing clock lines SEC1 to SEC4, and the scan clock lines SCC1 to SCC4 may be formed in a three-layer structure including three metal patterns, and each of the sensing control line SES, the control clock line SCK, the gate-on voltage line VOL, the first gate-off voltage line VOF1, and the second gate-off voltage line VOF2 may be formed in a two-layer structure including two metal patterns. As a result, it is possible to reduce the resistance value of each of the scan control lines in an ultra-high resolution such as 8K UHD, which makes it possible to reduce the RC delay of the scan control lines.

Figure 15:
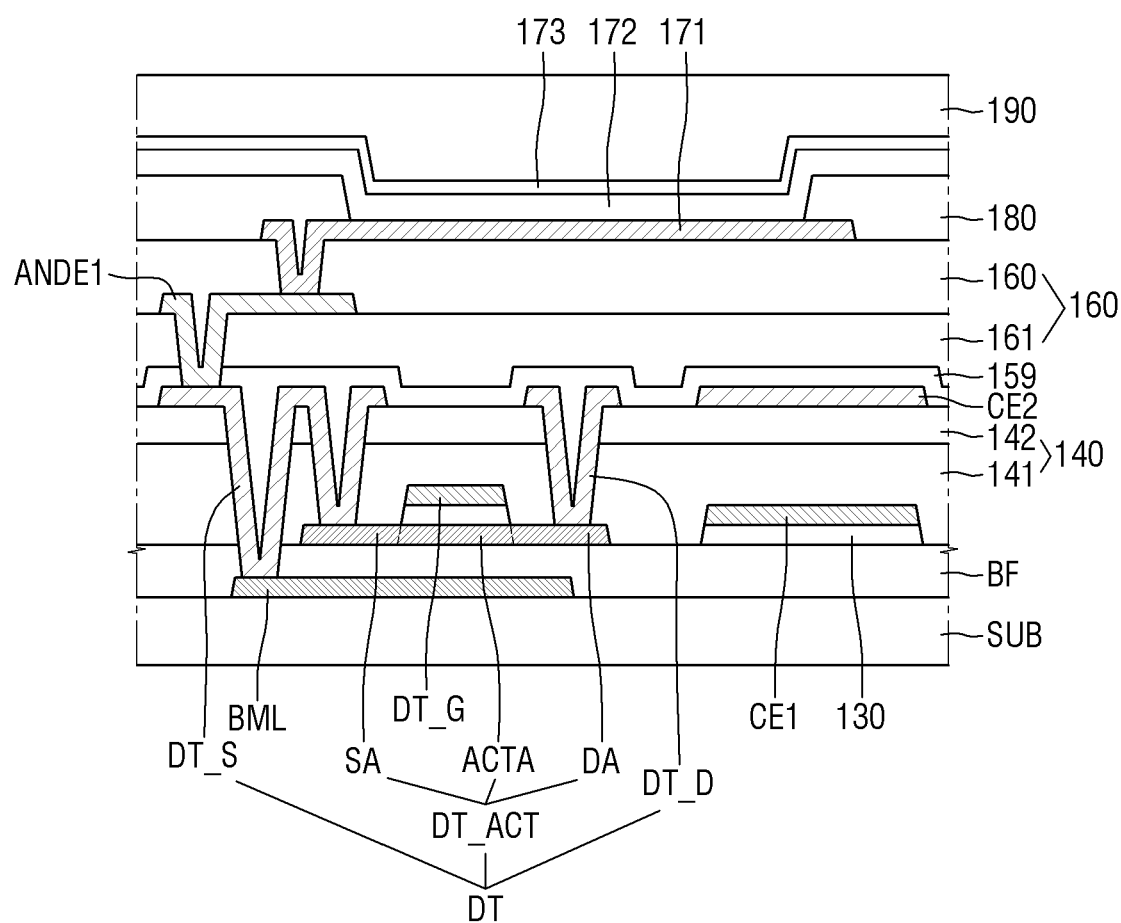
FIG. 15 is a cross-sectional view specifically illustrating an example of the sub-pixel of FIG. 4.
Figure 16:
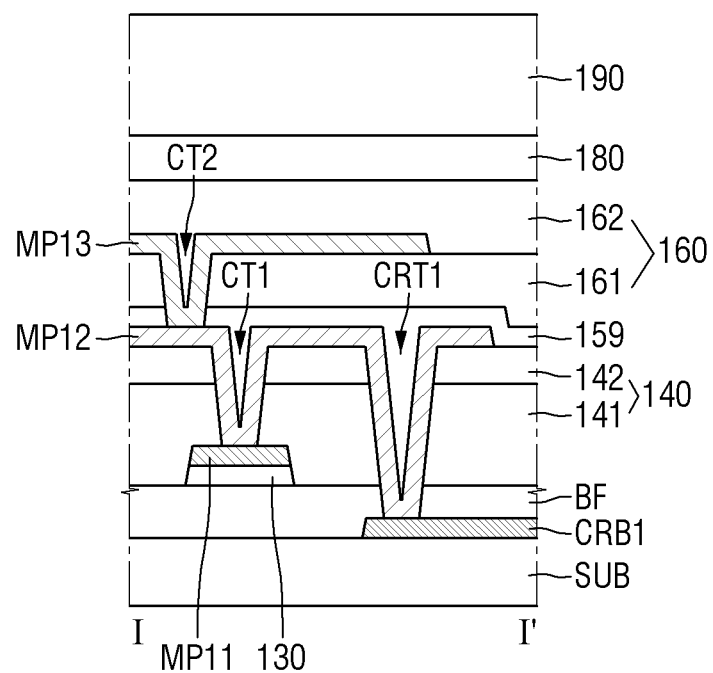
FIG. 16 is a cross-sectional view illustrating an example taken along line I-I' of FIG. 11.
Figure 17:
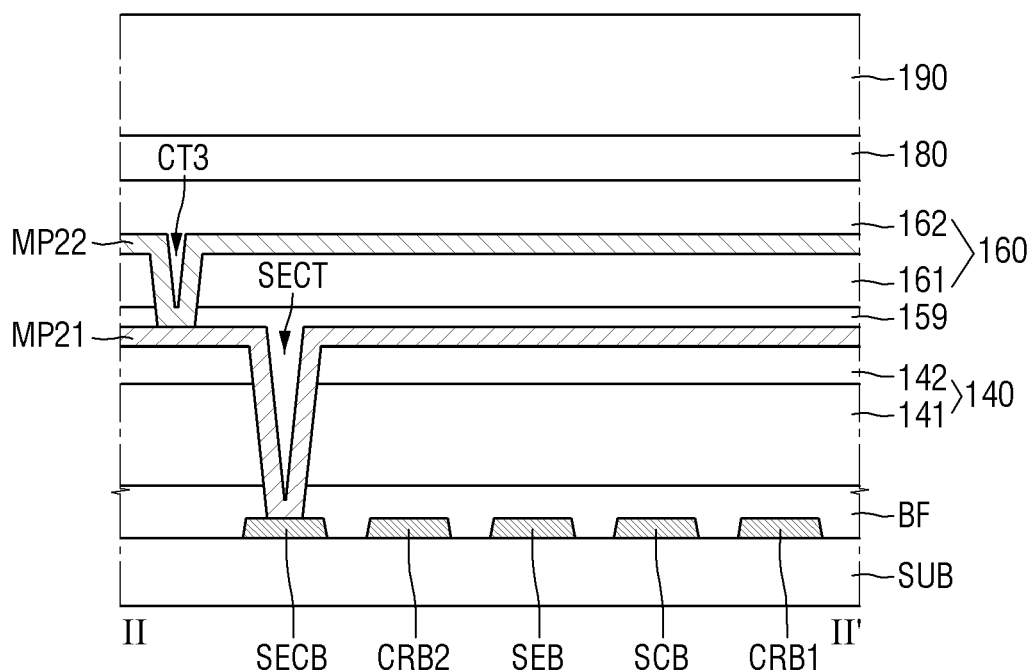
FIG. 17 is a cross-sectional view illustrating an example taken along line II-II' of FIG. 12.
Figure 18:
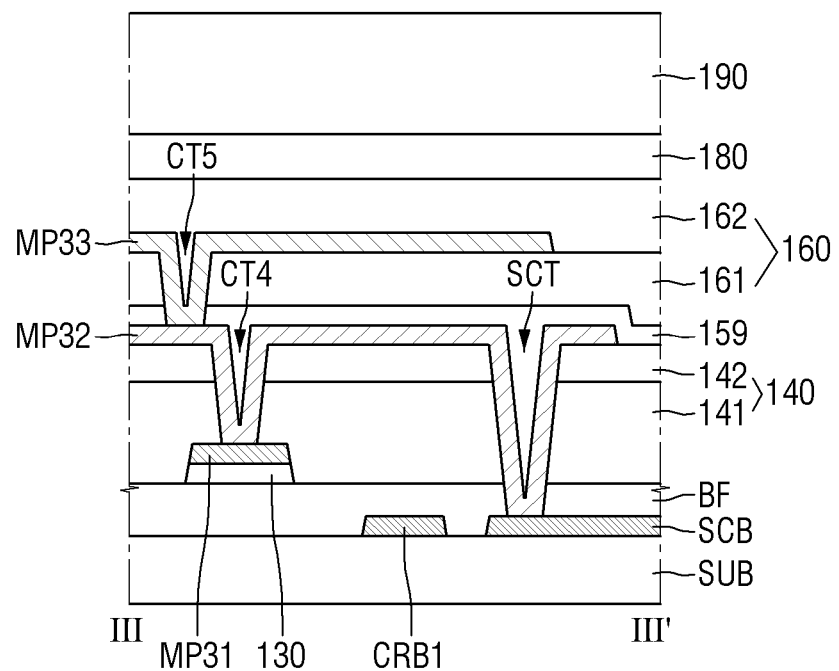
FIG. 18 is a cross-sectional view illustrating an example taken along line of FIG. 13.
Figure 19:
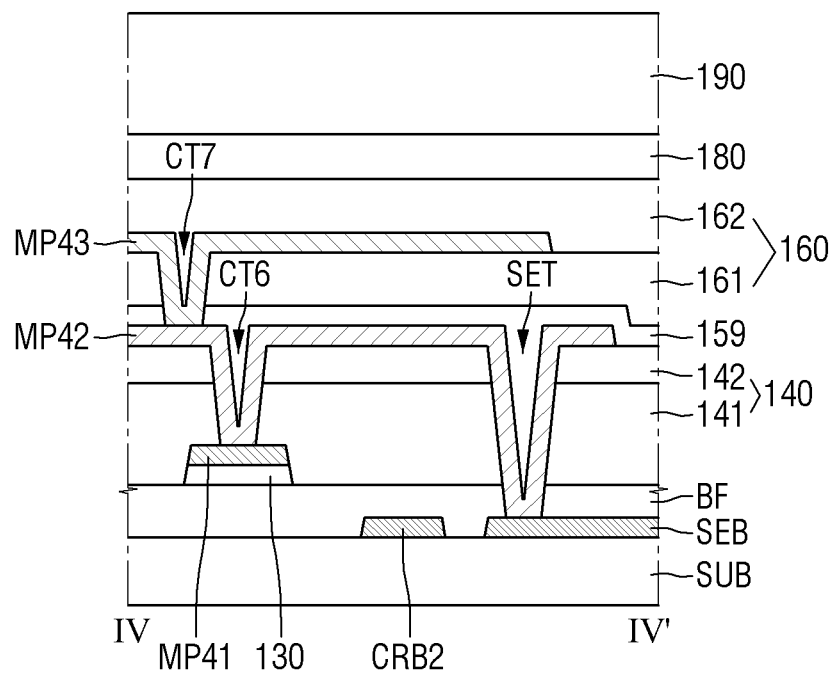
FIG. 19 is a cross-sectional view illustrating an example taken along line IV-IV' of FIG. 14.

FIG. 15 is a cross-sectional view specifically illustrating an example of the sub-pixel of FIG. 4. FIG. 16 is a cross-sectional view illustrating an example taken along line I-I' of FIG. 11. FIG. 17 is a cross-sectional view illustrating an example taken along line II-II' of FIG. 12. FIG. 18 is a cross-sectional view illustrating an example taken along line of FIG. 13. FIG. 19 is a cross-sectional view illustrating an example taken along line IV-IV' of FIG. 14.

Referring to FIGS. 15 to 19, the substrate SUB may be made of an insulating material such as glass, quartz, or polymer resin. The substrate SUB may be a rigid substrate or a flexible substrate which can be bent, folded, or rolled.

On one surface of the substrate SUB, a light blocking layer BML, the first and second carry connection lines CRB1 and CRB2, the scan connection line SCB, the sensing connection line SEB, the sensing control connection line SECB, the control connection line SCKB, the gate-on connection line VOB, the first gate-off connection line VFB1, and the second gate-off connection line VFB2 may be formed. The light blocking layer BML, which is a layer for blocking light incident on an active region ACTA of an active layer DT_ACT of the driving transistor DT, may overlap the active region ACTA of the active layer DT_ACT. The light blocking layer BML, the first and second carry connection lines CRB1 and CRB2, the scan connection line SCB, the sensing connection line SEB, the sensing control connection line SECB, the control connection line SCKB, the gate-on connection line VOB, the first gate-off connection line VFB1, and the second gate-off connection line VFB2 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

A buffer layer BF may be formed on the light blocking layer BML. The buffer layer BF may be formed on one surface of the substrate SUB to protect thin film transistors including the driving transistor DT and an organic light emitting layer 172 from moisture permeating through the substrate SUB which is susceptible to moisture permeation. The buffer layer BF may be formed of a plurality of inorganic layers that are alternately stacked. For example, the buffer layer BF may be formed of multiple layers in which one or more inorganic layers of a silicon nitride layer, a silicon oxynitride layer, a silicon oxide layer, a titanium oxide layer and an aluminum oxide layer are alternately stacked. The buffer layer BF may be omitted.

The thin film transistors including the driving transistor DT are formed on the buffer layer BF. FIG. 15 illustrates only the driving transistor DT among the thin film transistors for simplicity of description. The driving transistor DT includes the active layer DT_ACT, a gate electrode DT_G, a source electrode DT_S, and a drain electrode DT_D. Although FIG. 15 exemplarily illustrates that the driving transistor DT is configured to be of a top gate type in which the gate electrode DT_G is located on top of the active layer DT_ACT, it should be noted that the inventive concepts are not limited thereto. That is, the driving transistor DT may be configured to be of a bottom gate type in which the gate electrode DT_G is located under the active layer DT_ACT, or a double gate type in which the gate electrode DT_G is located on and under the active layer DT_ACT.

The active layer DT_ACT is formed on the buffer layer BF. The active layer DT_ACT may include polycrystalline silicon, monocrystalline silicon, low-temperature polycrystalline silicon, amorphous silicon, or an oxide semiconductor. For example, the oxide semiconductor may include a binary compound (ABx), a ternary compound (ABxCy), or a quaternary compound (ABxCyDz) including indium, zinc, gallium, tin, titanium, aluminum, hafnium (Hf), zirconium (Zr), magnesium (Mg) and the like. For example, the active layer DT_ACT may include ITZO (an oxide including indium, tin and titanium) or IGZO (an oxide including indium, gallium and tin).

The active layer DT_ACT may include the active region ACTA, a source region SA, and a drain region DA. The active region ACTA, which is a semiconductor area, serves as the channel of the driving transistor DT. The source region SA and the drain region DA, which are conductive areas, may have conductivity.

A gate insulating layer 130 may be formed on a part of the active layer DT_ACT and a part of the buffer layer BF. The gate insulating layer 130 may be formed of an inorganic layer, for example, a silicon nitride layer, a silicon oxynitride layer, a silicon oxide layer, a titanium oxide layer, or an aluminum oxide layer. The gate insulating layer 130 may be formed only in the area overlapping the gate electrode DT_G, a first capacitor electrode CE1, the (1-1)-th metal pattern MP11, the (3-1)-th metal pattern MP31, and the (4-1)-th metal pattern MP41.

On the gate insulating layer 130, the gate electrode DT_G, the first capacitor electrode CE1, the (1-1)-th metal pattern MP11 of each of the carry clock lines CRC1 to CRC3, the (3-1)-th metal pattern MP31 of each of the scan clock lines SCC1 to SCC4, and the (4-1)-th metal pattern MP41 of each of the sensing clock lines SEC1 to SEC4 may be formed. The gate electrode DT_G, the first capacitor electrode CE1, the (1-1)-th metal pattern MP11, the (3-1)-th metal pattern MP31, and the (4-1)-th metal pattern MP41 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

An interlayer insulating layer 140 may be formed on the gate electrode DT_G, the first capacitor electrode CE1, the (1-1)-th metal pattern MP11 of each of the carry clock lines CRC1 to CRC3, the (3-1)-th metal pattern MP31 of each of the scan clock lines SCC1 to SCC4, and the (4-1)-th metal pattern MP41 of each of the sensing clock lines SEC1 to SEC4. The interlayer insulating layer 140 may include the first interlayer insulating layer 141 and the second interlayer insulating layer 142. The first interlayer insulating layer 141 and the second interlayer insulating layer 142 may be formed of an inorganic layer, for example, a silicon nitride layer, a silicon oxynitride layer, a silicon oxide layer, a titanium oxide layer, or an aluminum oxide layer.

The source electrode DT_S, the drain electrode DT_D, and the second capacitor electrode CE2 may be formed on the interlayer insulating layer 140. Further, on the interlayer insulating layer 140, the (1-2)-th metal pattern MP12 of each of the carry clock lines CRC1 to CRC3, the (3-2)-th metal pattern MP32 of each of the scan clock lines SCC1 to SCC4, and the (4-2)-th metal pattern MP42 of each of the sensing clock lines SEC1 to SEC4 may be formed. Further, on the interlayer insulating layer 140, the (2-1)-th metal pattern MP21 of each of the sensing control line SES, the control clock line SCK, the gate-on voltage line VOL, the first gate-off voltage line VOF1, and the second gate-off voltage line VFL2 VOF2 may be formed. The source electrode DT_S, the drain electrode DT_D, the (1-2)-th metal pattern MP12, the (3-2)-th metal pattern MP32, the (4-2)-th metal pattern MP42, and the (2-1)-th metal pattern MP21 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

As shown in FIG. 15, the source electrode DT_S may be connected to the source region SA of the active layer DT_ACT through the contact hole penetrating the interlayer insulating layer 140. The drain electrode DT_D may be connected to the drain region DA of the active layer DT_ACT through the contact hole penetrating the interlayer insulating layer 140.

As shown in FIG. 16, the (1-2)-th metal pattern MP12 of the first carry clock line CRC1 may be connected to the carry connection line CRB through the carry contact hole CRT1 penetrating the buffer layer BF and the interlayer insulating layer 140. The (1-2)-th metal pattern MP12 of the first carry clock line CRC1 may be connected to the (1-1)-th metal pattern MP11 through the first contact hole CT1 penetrating the interlayer insulating layer 140.

As shown in FIG. 17, the (2-1)-th metal pattern MP21 of the sensing control line SEC may be connected to the sensing control connection line SECB through the sensing control contact hole SECT penetrating the buffer layer BF and the interlayer insulating layer 140.

As shown in FIG. 18, the (3-2)-th metal pattern MP32 of the third scan clock line SCC3 may be connected to the scan connection line SCB through the scan contact hole SCT penetrating the buffer layer BF and the interlayer insulating layer 140. The (3-2)-th metal pattern MP32 of the third scan clock line SCC3 may be connected to the (3-1)-th metal pattern MP31 through the fourth contact hole CT4 penetrating the interlayer insulating layer 140.

As shown in FIG. 19, the (4-2)-th metal pattern MP42 of the third sensing clock line SEC3 may be connected to the sensing connection line SEB through the sensing contact hole SET penetrating the buffer layer BF and the interlayer insulating layer 140. The (4-2)-th metal pattern MP42 of the third sensing clock line SEC3 may be connected to the (4-1)-th metal pattern MP41 through the sixth contact hole CT6 penetrating the interlayer insulating layer 140.

A passivation layer 150 for insulating the thin film transistors may be formed on the source electrode 213 and the drain electrode DT_D. The passivation layer 150 may be formed of an inorganic layer, e.g., a silicon nitride layer, a silicon oxynitride layer, a silicon oxide layer, a titanium oxide layer, or an aluminum oxide layer.

A planarization layer 160 for flattening a stepped portion formed by the thin film transistors may be formed on the passivation layer 150. The planarization layer 160 may include a first planarization layer 161 and a second planarization layer 162. The first planarization layer 161 and the second planarization layer 162 may be formed of an organic layer such as acryl resin, epoxy resin, phenolic resin, polyamide resin, polyimide resin and the like.

An anode connection electrode ANDE may be formed on the first planarization layer 161. Further, on the first planarization layer 161, the (1-3)-th metal pattern MP13 of each of the carry clock lines CRC1 to CRC3, the (3-3)-th metal pattern MP33 of each of the scan clock lines SCC1 to SCC4, and the (4-3)-th metal pattern MP43 of each of the sensing clock lines SEC1 to SEC4 may be formed. Further, on the first planarization layer 161, the (2-2)-th metal pattern MP22 of each of the sensing control line SES, the control clock line SCK, the gate-on voltage line VOL, the first gate-off voltage line VOF1, and the second gate-off voltage line VOF2 may be formed.

As shown in FIG. 15, a first anode connection electrode ANDE1 may be connected to the source electrode DT_S or the drain electrode DT_D through the contact hole penetrating the passivation layer 159 and the first planarization layer 161. As shown in FIG. 16, the (1-3)-th metal pattern MP13 of the first carry clock line CRC1 may be connected to the (1-2)-th metal pattern MP12 through the second contact hole CT2 penetrating the passivation layer 159 and the first planarization layer 161. As shown in FIG. 17, the (2-2)-th metal pattern MP22 of the sensing control line SES may be connected to the (2-1)-th metal pattern MP12 through the third contact hole CT3 penetrating the passivation layer 159 and the first planarization layer 161. As shown in FIG. 18, the (3-3)-th metal pattern MP33 of the third scan clock line SCC3 may be connected to the (3-2)-th metal pattern MP32 through the fifth contact hole CT5 penetrating the passivation layer 159 and the first planarization layer 161. As shown in FIG. 19, the (4-3)-th metal pattern MP43 of the third sensing clock line SEC3 may be connected to the (4-2)-th metal pattern MP42 through the seventh contact hole CT7 penetrating the passivation layer 159 and the first planarization layer 161.

The anode connection electrode ANDE, the (1-3)-th metal pattern MP13, the (2-2)-th metal pattern MP22, the (3-3)-th metal pattern MP33, and the (4-3)-th metal pattern MP43 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

A first electrode 171 and a pixel defining layer 180 are formed on the second planarization layer 162. The first electrode 171 may be connected to the anode connection electrode ANDE through the contact hole penetrating the second planarization layer 162. In a top emission structure in which light is emitted toward the second electrode 173 when viewed with respect to the organic light emitting layer 172, the first electrode 171 may be formed of a metal material having high reflectivity such as a stacked structure (Ti/Al/Ti) of aluminum and titanium, a stacked structure (ITO/Al/ITO) of aluminum and ITO, an APC alloy, and a stacked structure (ITO/APC/ITO) of an APC alloy and ITO. The APC alloy is an alloy of silver (Ag), palladium (Pd) and copper (Cu). Alternatively, in a bottom emission structure in which light is emitted toward the first electrode 171 when viewed with respect to the organic light emitting layer 172, the first electrode 171 may be formed of a transparent conductive material (TCO) such as ITO or IZO capable of transmitting light, or a semi-transmissive conductive material such as magnesium (Mg), silver (Ag), or an alloy of magnesium (Mg) and silver (Ag). In this case, when the first electrode 171 is formed of a semi-transmissive metal material, the light emission efficiency can be increased due to a micro-cavity effect.

The pixel defining layer 180 may be formed to cover the edge of the first electrode 171 on the second planarization layer 162 in order to serve to define the emission areas. Each of the emission areas refers to a region where the first electrode 171, the organic light emitting layer 172 and the second electrode 173 are stacked sequentially and holes from the first electrode 171 and electrons from the second electrode 173 are combined with each other in the organic light emitting layer 172 to emit light. The pixel defining layer 180 may be formed of an organic layer such as acryl resin, epoxy resin, phenolic resin, polyamide resin, polyimide resin and the like.

The organic light emitting layer 172 may be disposed on the first electrode 171 and the pixel defining layer 180. The organic light emitting layer 172 may include an organic material to emit light in a predetermined color. For example, the organic light emitting layer 172 may include a hole transporting layer, an organic material layer, and an electron transporting layer. The organic light emitting layer 172 may be a common layer commonly formed in the emission areas.

The second electrode 173 is formed on the organic light emitting layer 172. The second electrode 173 may be formed to cover the organic light emitting layer 172. The second electrode 173 may be a common layer commonly formed in the emission areas. A capping layer may be formed on the second electrode 173. In the top emission structure, the second electrode 173 may be formed of a transparent conductive material (TCO) such as ITO or IZO capable of transmitting light or a semi-transmissive conductive material such as magnesium (Mg), silver (Ag), or an alloy of magnesium (Mg) and silver (Ag). When the second electrode 173 is formed of a semi-transmissive metal material, the light emission efficiency can be increased due to a micro-cavity effect. Alternatively, in the bottom emission structure, the second electrode 173 may be formed of a metal material, having high reflectivity, such as a stacked structure (Ti/Al/Ti) of aluminum (Al) and titanium (Ti), a stacked structure (ITO/Al/ITO) of Al and ITO, an APC alloy, a stacked structure (ITO/APC/ITO) of an APC alloy and ITO, or the like. The APC alloy is an alloy of silver (Ag), palladium (Pd) and copper (Cu).

An encapsulation layer 190 is formed on the second electrode 173. The encapsulation layer 190 is disposed on the second electrode 173. The encapsulation layer 190 may include at least one inorganic layer to prevent oxygen or moisture from permeating into the organic light emitting layer 172 and the second electrode 173. In addition, the encapsulation layer 190 may include at least one organic layer to protect the light emitting element layer EML from foreign substances such as dust. For example, the encapsulation layer 190 may include a first inorganic layer disposed on the second electrode 173, an organic layer disposed on the first inorganic layer, and a second inorganic layer disposed on the organic layer. The first inorganic layer and the second inorganic layer may be formed of a silicon nitride layer, a silicon oxynitride layer, a silicon oxide layer, a titanium oxide layer, or an aluminum oxide layer, but are not limited thereto. The organic layer may be formed of acryl resin, epoxy resin, phenolic resin, polyamide resin, polyimide resin, or the like, but is not limited thereto.

Meanwhile, the (1-1)-th metal pattern MP11, the (3-1)-th metal pattern MP31, and the (4-1)-th metal pattern MP41 are disposed on the same layer as the gate electrode DT_G, and the (1-2)-th metal pattern MP12, the (3-2)-th metal pattern MP32, and the (4-2)-th metal pattern MP42 are disposed on the same layer as the source electrode DT_S. Further, the (1-3)-th metal pattern MP13, the (3-3)-th metal pattern MP33, and the (4-3)-th metal pattern MP43 are disposed on the same layer as the drain electrode DT_D, and the first carry connection line CRB1, the second carry connection line CRB2, the sensing connection line SEB, and the scan connection line SCB are disposed on the same layer as the light blocking layer BML. In this case, the distance between the gate electrode DT_G and the light blocking layer BML is smaller than the distance between the source electrode DT_S and the light blocking layer BML and the distance between the drain electrode DT_D and the light blocking layer BML. Therefore, in order to reduce the size of the parasitic capacitance generated in the area in which the first carry connection line CRB1, the second carry connection line CRB2, the sensing connection line SEB, and the scan connection line SCB overlap the carry clock lines CRC1 to CRC3, the sensing clock lines SEC1 to SEC4, and the scan clock lines SCC1 to SCC4, each of the (1-1)-th metal pattern MP11, the (3-1)-th metal pattern MP31, and the (4-1)-th metal pattern MP41 may not overlap at least one of the first carry connection line CRB1, the second carry connection line CRB2, the sensing connection line SEB, or the scan connection line SCB. Therefore, it is possible to reduce the resistance value of each of the scan control lines in an ultra-high resolution such as 8K UHD, which makes it possible to reduce the RC delay of the scan control lines.

Figure 20:
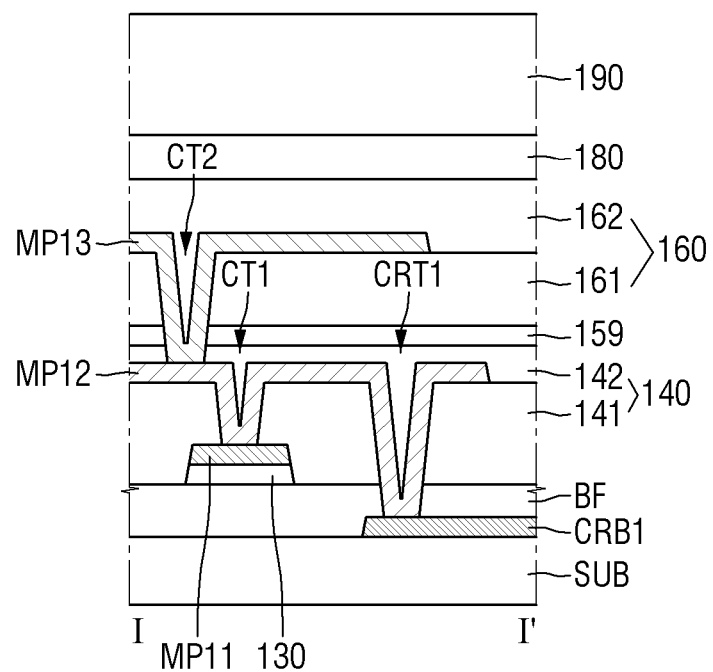
FIG. 20 is a cross-sectional view illustrating an example taken along line I-I' of FIG. 11.
Figure 21:
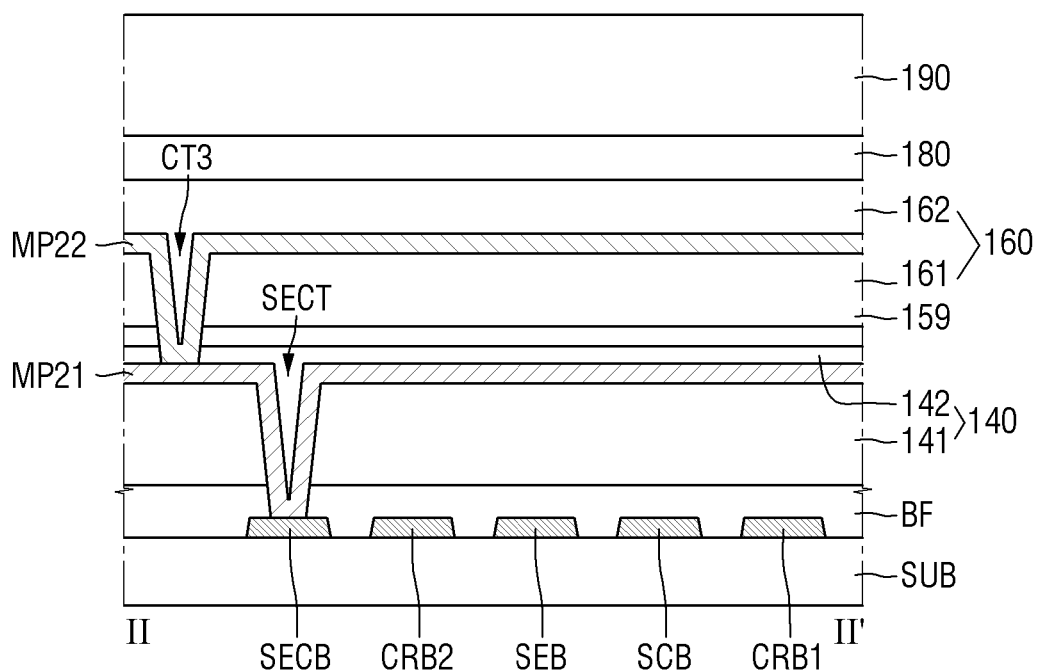
FIG. 21 is a cross-sectional view illustrating an example taken along line II-II' of FIG. 12.
Figure 22:
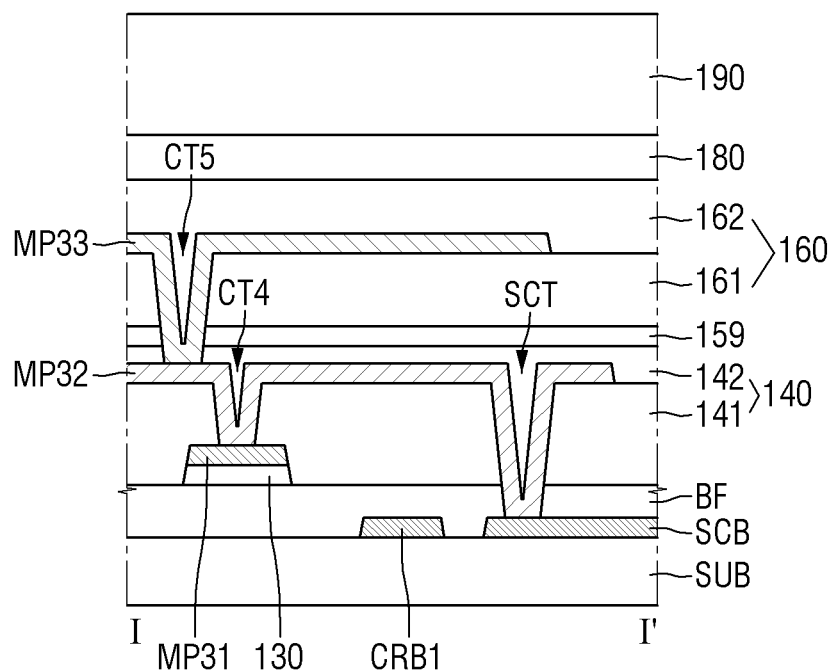
FIG. 22 is a cross-sectional view illustrating an example taken along line of FIG. 13.
Figure 23:
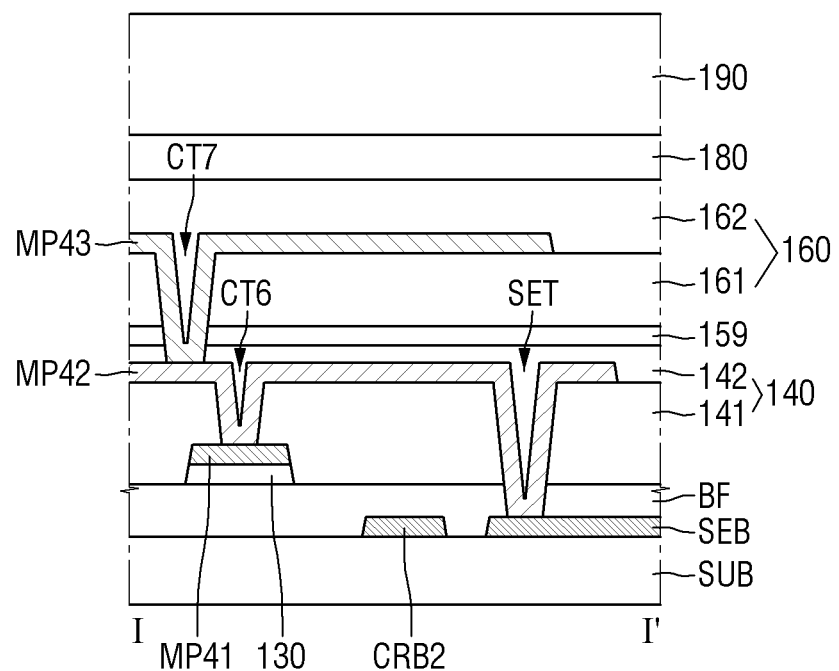
FIG. 23 is a cross-sectional view illustrating an example taken along line IV-IV' of FIG. 14.

FIG. 20 is a cross-sectional view illustrating an example taken along line I-I' of FIG. 11. FIG. 21 is a cross-sectional view illustrating an example taken along line II-IP of FIG. 12. FIG. 22 is a cross-sectional view illustrating an example taken along line of FIG. 13. FIG. 23 is a cross-sectional view illustrating an example taken along line IV-IV' of FIG. 14.

The embodiment of FIGS. 20 to 23 is different from the embodiment illustrated in FIGS. 16 to 19 in that the (1-2)-th metal pattern MP12 of each of the carry clock lines CRC1 to CRC3, the (3-2)-th metal pattern MP32 of each of the scan clock lines SCC1 to SCC4, and the (4-2)-th metal pattern MP42 of each of the sensing clock lines SEC1 to SEC4 are formed on the first interlayer insulating layer 141 instead of the second interlayer insulating layer 142. Further, the embodiment of FIGS. 20 to 23 is different from the embodiment illustrated in FIGS. 16 to 19 in that the (2-1)-th metal pattern MP21 of each of the sensing control line SES, the control clock line SCK, the gate-on voltage line VOL, the first gate-off voltage line VOF1, and the second gate-off voltage line VOF2 is formed on the first interlayer insulating layer 141 instead of the second interlayer insulating layer 142.

As shown in FIG. 20, the (1-2)-th metal pattern MP12 of the first carry clock line CRC1 may be connected to the first carry connection line CRB1 through the carry contact hole CRT1 penetrating the buffer layer BF and the first interlayer insulating layer 141. The (1-2)-th metal pattern MP12 of the first carry clock line CRC1 may be connected to the (1-1)-th metal pattern MP11 through the first contact hole CT1 penetrating the first interlayer insulating layer 141.

As shown in FIG. 21, the (2-1)-th metal pattern MP21 of the sensing control line SEC may be connected to the sensing control connection line SECB through the sensing control contact hole SECT penetrating the buffer layer BF and the first interlayer insulating layer 141.

As shown in FIG. 22, the (3-2)-th metal pattern MP32 of the third scan clock line SCC3 may be connected to the scan connection line SCB through the scan contact hole SCT penetrating the buffer layer BF and the first interlayer insulating layer 141. The (3-2)-th metal pattern MP32 of the third scan clock line SCC3 may be connected to the (3-1)-th metal pattern MP31 through the fourth contact hole CT4 penetrating the first interlayer insulating layer 141.

As shown in FIG. 23, the (4-2)-th metal pattern MP42 of the third sensing clock line SEC3 may be connected to the sensing connection line SEB through the sensing contact hole SET penetrating the buffer layer BF and the first interlayer insulating layer 141. The (4-2)-th metal pattern MP42 of the third sensing clock line SEC3 may be connected to the (4-1)-th metal pattern MP41 through the sixth contact hole CT6 penetrating the first interlayer insulating layer 141.

Figure 24:
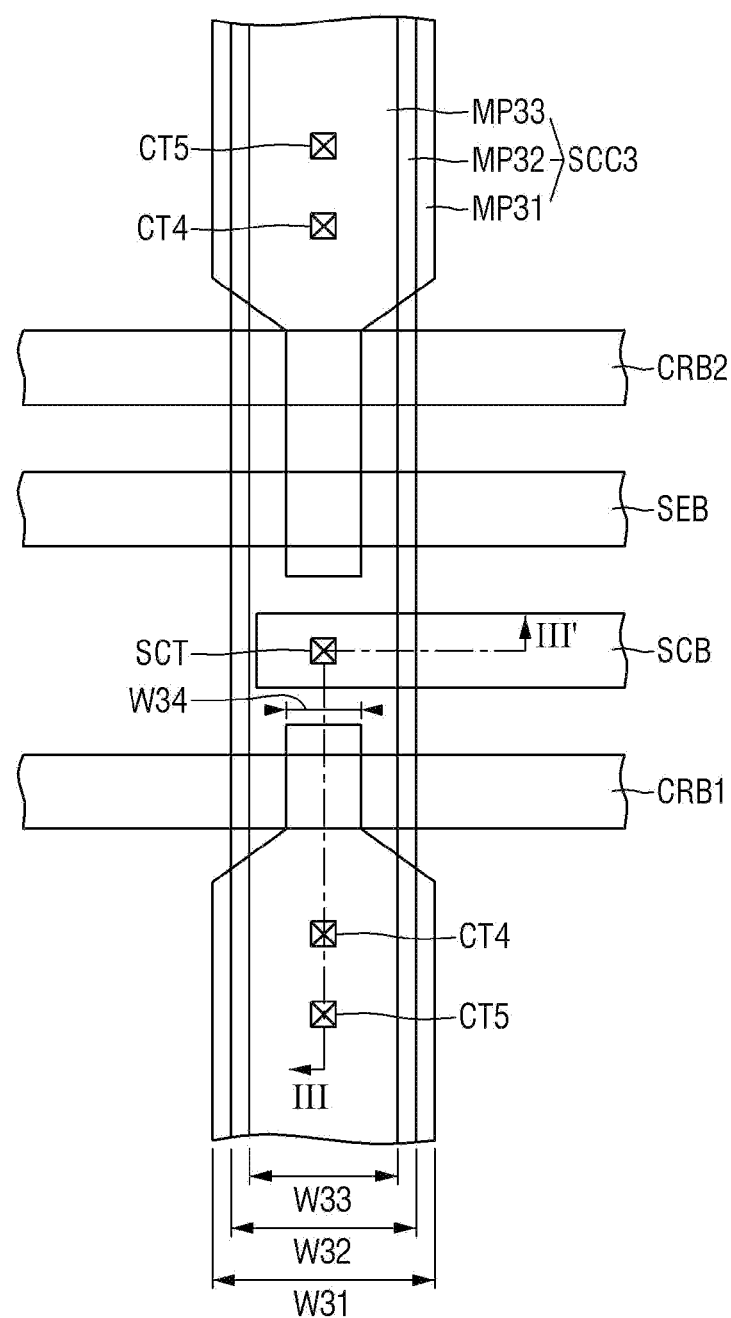
FIG. 24 is an enlarged plan view specifically illustrating the third scan clock line and the scan connection line of FIG. 10.
Figure 25:
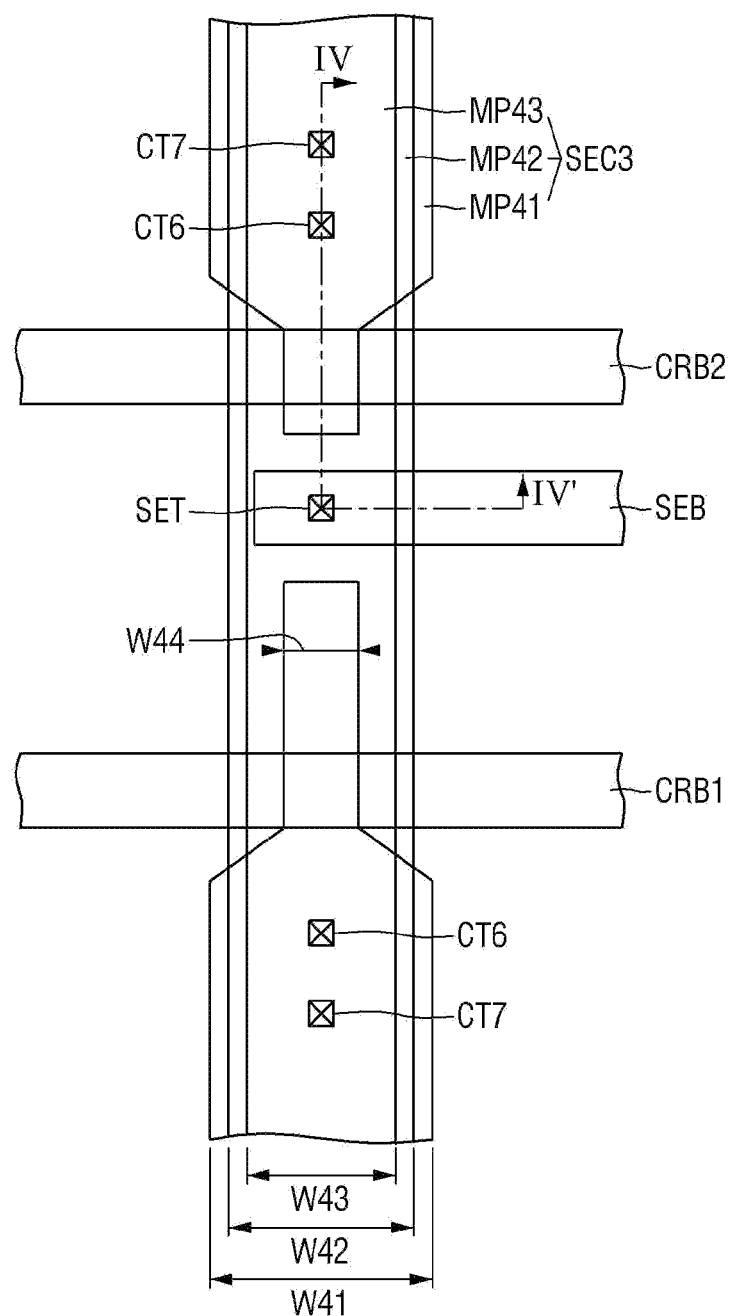
FIG. 25 is an enlarged plan view specifically illustrating the third sensing clock line and the sensing connection line of FIG. 10.

FIG. 24 is an enlarged plan view specifically illustrating the third scan clock line and the scan connection line of FIG. 10. FIG. 25 is an enlarged plan view specifically illustrating the third sensing clock line and the sensing connection line of FIG. 10.

As shown in FIG. 24, the (3-1)-th metal pattern MP31 of each of the scan clock lines SCC1 to SCC4 may overlap the first carry connection line CRB1, the second carry connection line CRB2, and the sensing connection line SEC. In this case, in order to reduce the size of the parasitic capacitance, a width W34 of the (3-1)-th metal pattern MP31 of the third scan clock line SCC3 may be formed to be smaller than the width W33 of the (3-3)-th metal pattern MP33 in the area overlapping the first carry connection line CRB1, the second carry connection line CRB2, and the sensing connection line SEC.

As shown in FIG. 25, the (3-1)-th metal pattern MP31 of each of the sensing clock lines SCC1 to SCC4 may overlap the first carry connection line CRB1 and the second carry connection line CRB2. In this case, in order to reduce the size of the parasitic capacitance, a width W41 of the (4-1)-th metal pattern MP41 of the third sensing clock line SEC1 may be formed to be smaller than a width W43 of the (4-3)-th metal pattern MP33 in the area overlapping the first carry connection line CRB1 and the second carry connection line CRB2.

Figure 26:
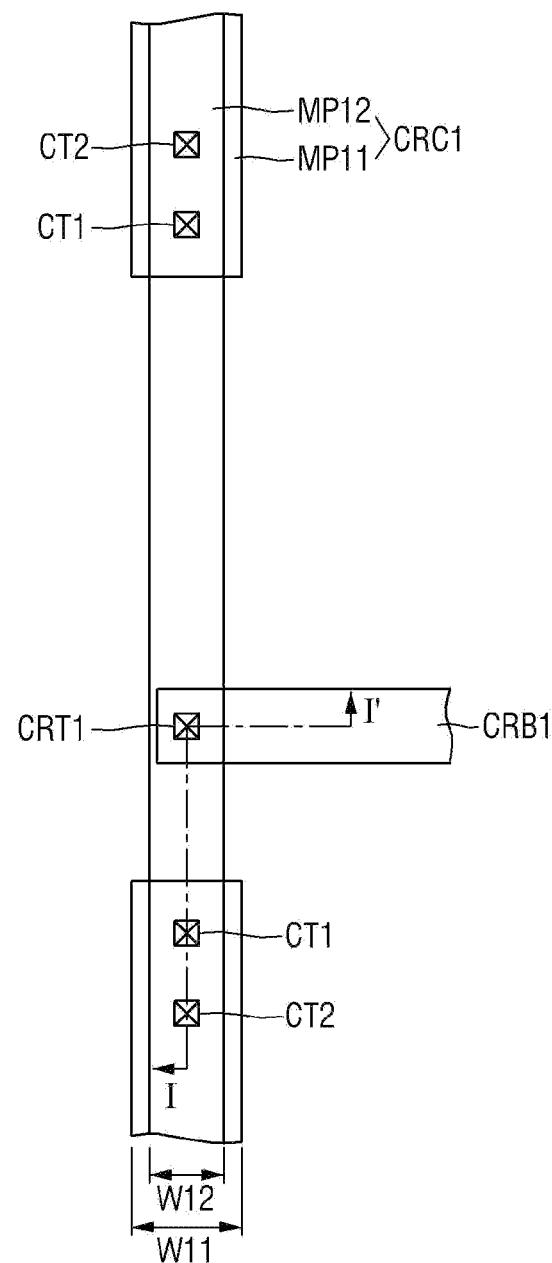
FIG. 26 is an enlarged plan view specifically illustrating the first carry clock line and the first carry connection line of FIG. 10.
Figure 27:
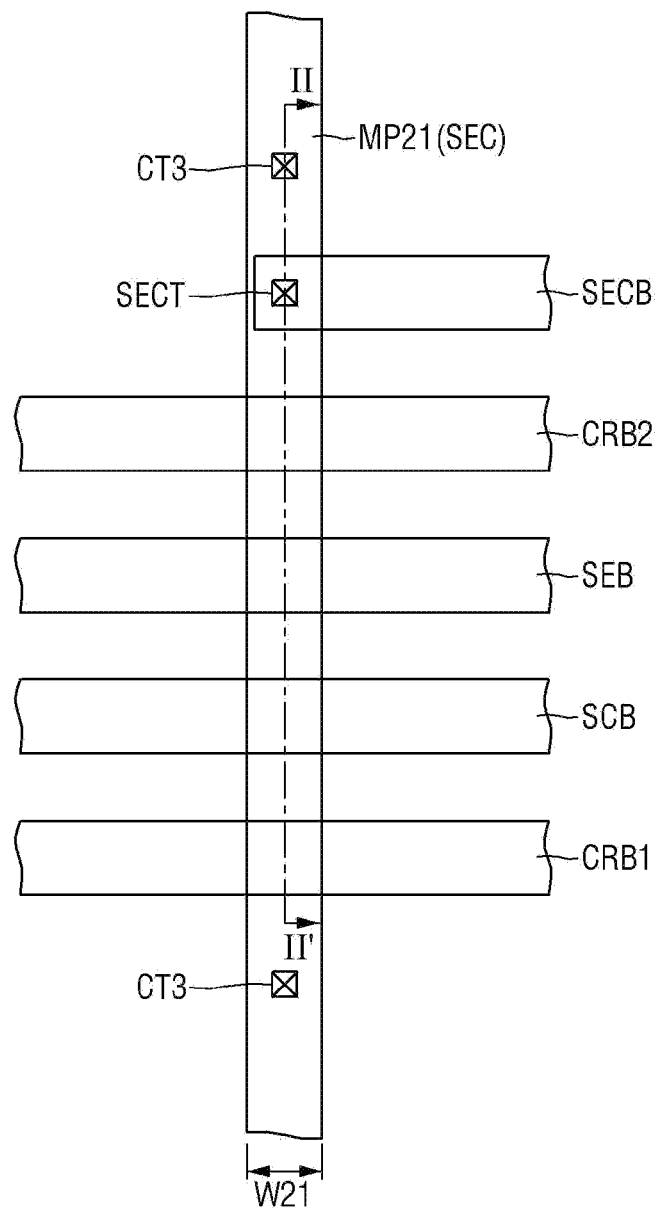
FIG. 27 is an enlarged plan view specifically illustrating the sensing control line and the sensing connection line of FIG. 10.
Figure 28:
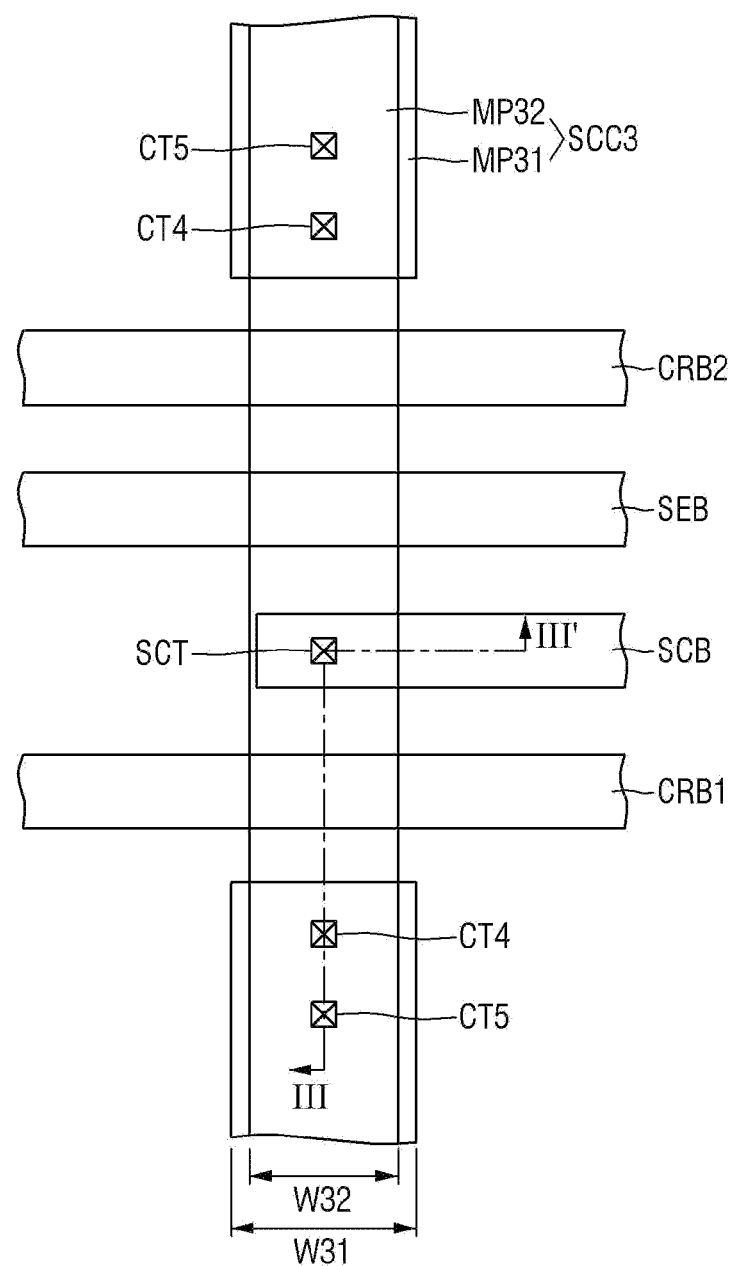
FIG. 28 is an enlarged plan view specifically illustrating the third scan clock line and the scan connection line of FIG. 10.
Figure 29:
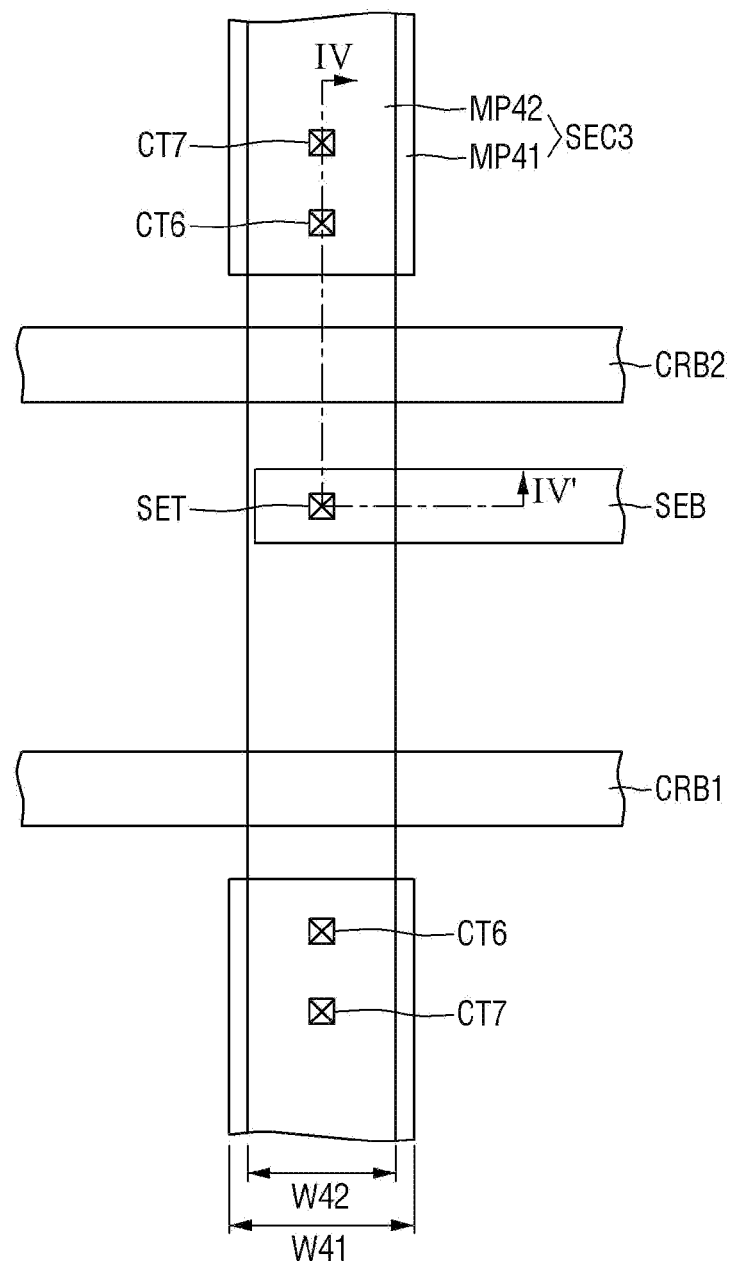
FIG. 29 is an enlarged plan view specifically illustrating the third sensing clock line and the sensing connection line of FIG. 10.

FIG. 26 is an enlarged plan view specifically illustrating the first carry clock line and the first carry connection line of FIG. 10. FIG. 27 is an enlarged plan view specifically illustrating the sensing control line and the sensing connection line of FIG. 10. FIG. 28 is an enlarged plan view specifically illustrating the third scan clock line and the scan connection line of FIG. 10. FIG. 29 is an enlarged plan view specifically illustrating the third sensing clock line and the sensing connection line of FIG. 10.

The embodiment of FIG. 26 is different from the embodiment illustrated in FIG. 11 in that each of the carry clock lines CRC1 to CRC3 has a two-layer structure including the (1-1)-th metal pattern MP11 and the (1-2)-th metal pattern MP12.

The embodiment of FIG. 27 is different from the embodiment illustrated in FIG. 12 in that each of the sensing control line SEC, the control clock line SCK, the gate-on voltage line VOL, the first gate-off voltage line VOF1, and the second gate-off voltage line VOF2 has a single-layer structure including the (2-1)-th metal pattern MP21.

The embodiment of FIG. 28 is different from the embodiment illustrated in FIG. 13 in that each of the scan clock lines SCC1 to SCC4 has a two-layer structure including the (3-1)-th metal pattern MP31 and the (3-2)-th metal pattern MP32.

The embodiment of FIG. 29 is different from the embodiment shown in FIG. 14 in that each of the sensing clock lines SEC1 to SEC4 has a two-layer structure including the (4-1)-th metal pattern MP41 and the (4-2)-th metal pattern MP42.

Figure 30:
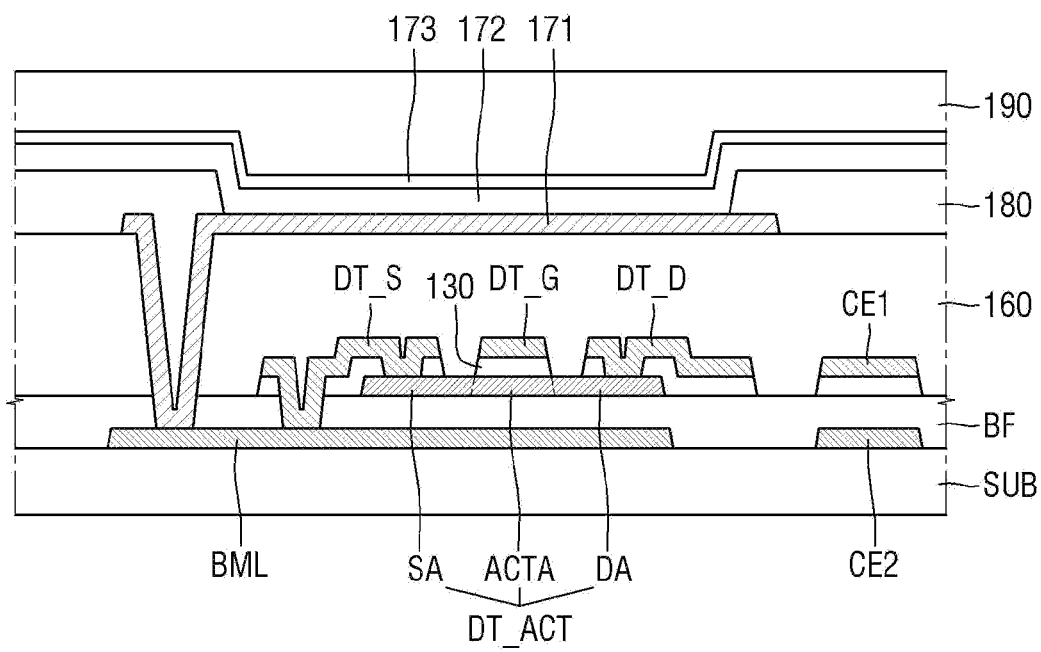
FIG. 30 is a cross-sectional view illustrating an example of the sub-pixel of FIG. 4 in detail.
Figure 31:
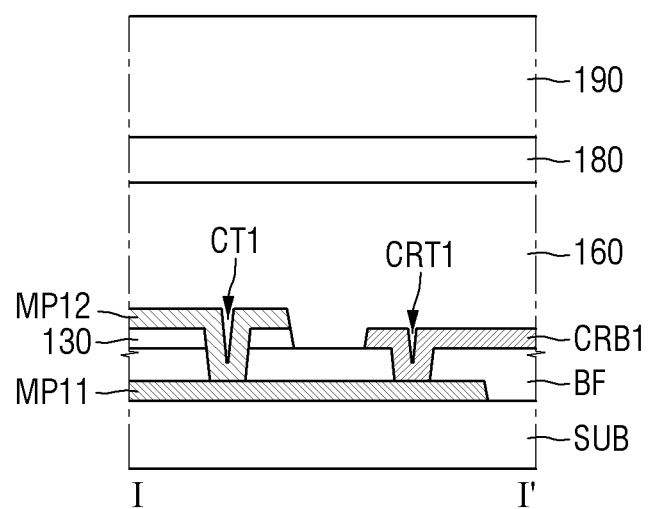
FIG. 31 is a cross-sectional view illustrating an example taken along line I-I' of FIG. 26.
Figure 32:
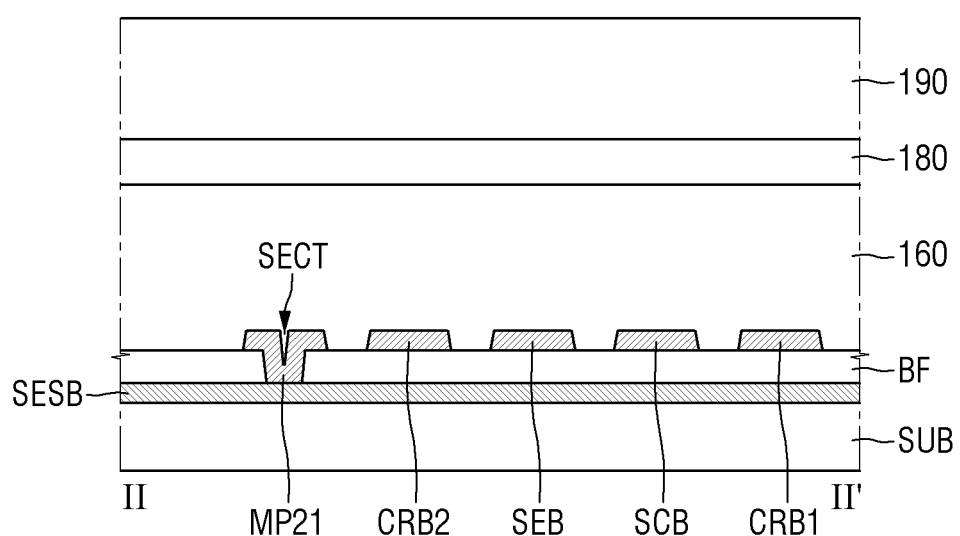
FIG. 32 is a cross-sectional view illustrating an example taken along line II-II' of FIG. 27.
Figure 33:
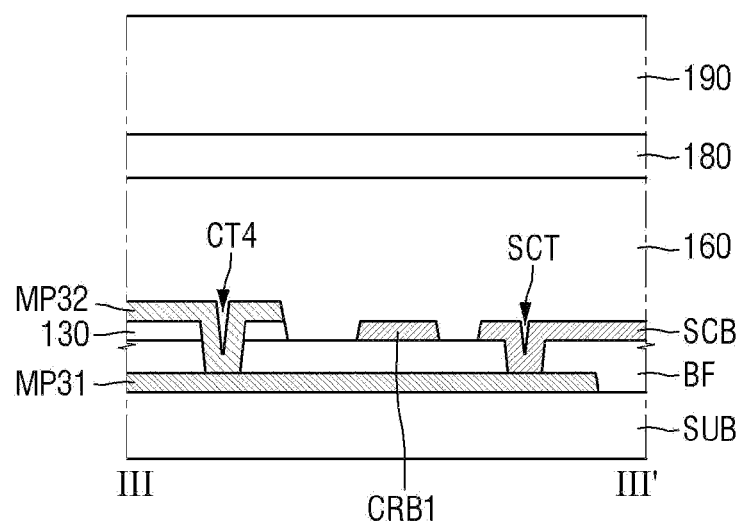
FIG. 33 is a cross-sectional view illustrating an example taken along line of FIG. 28.
Figure 34:
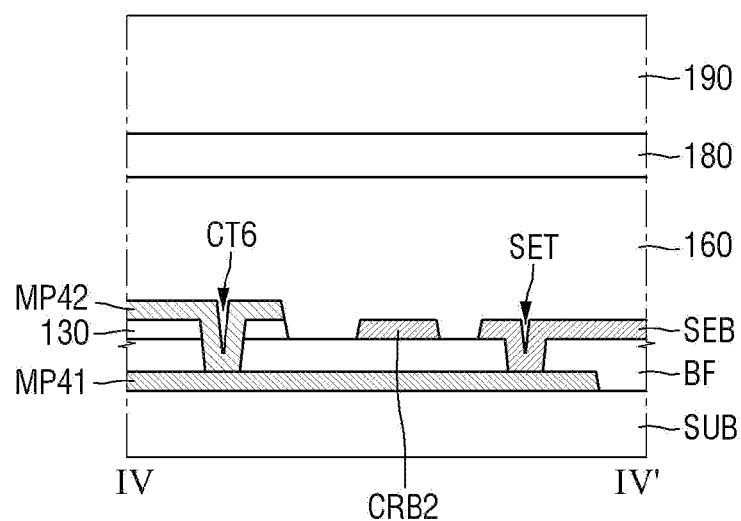
FIG. 34 is a cross-sectional view illustrating an example taken along line IV-IV' of FIG. 29.

FIG. 30 is a cross-sectional view illustrating an example of the sub-pixel of FIG. 4 in detail. FIG. 31 is a cross-sectional view illustrating an example taken along line I-I' of FIG. 26. FIG. 32 is a cross-sectional view illustrating an example taken along line of FIG. 27. FIG. 33 is a cross-sectional view illustrating an example taken along line of FIG. 28. FIG. 34 is a cross-sectional view illustrating an example taken along line IV-IV' of FIG. 29.

The embodiment of FIGS. 30 to 34 is different from the embodiment of FIGS. 15 to 19 in that the source electrode DT_S and the drain electrode DT_D of the driving transistor DT are formed on the same layer as the gate electrode DT_G, the second capacitor electrode CE2 is formed on the same layer as the light blocking layer BML, and the first electrode 171 is connected to the light blocking layer BML.

Referring to FIGS. 30 to 34, the light blocking layer BML, the second capacitor electrode CE2, and the (1-1)-th metal pattern MP11 of each of the carry clock lines CRC1 to CRC3, the (3-1)-th metal pattern MP31 of each of the scan clock lines SCC1 to SCC4, and the (4-1)-th metal pattern MP41 of each of the sensing clock lines SEC1 to SEC4 may be formed on one surface of the substrate SUB. The buffer layer BF may be formed on the light blocking layer BML, the second capacitor electrode CE2, the (1-1)-th metal pattern MP11, the (3-1)-th metal pattern MP31, and the (4-1)-th metal pattern MP41.

On the buffer layer BF, the active layer DT_ACT, the first and second carry connection lines CRB1 and CRB2, the scan connection line SCB, the sensing connection line SEB, the sensing control connection line SECB, the control connection line SCKB, the gate-on connection line VOB, the first gate-off connection line VFB1, and the second gate-off connection line VFB2 may be formed. The first and second carry connection lines CRB1 and CRB2, the scan connection line SCB, the sensing connection line SEB, the sensing control connection line SECB, the control connection line SCKB, the gate-on connection line VOB, the first gate-off connection line VFB1, and the second gate-off connection line VFB2 may be made to be made conductive and have conductivity.

As shown in FIG. 31, the (1-1)-th metal pattern MP12 of the first carry clock line CRC1 may be connected to the first carry connection line CRB1 through the first carry contact hole CRT1 penetrating the buffer layer BF. As shown in FIG. 32, the (2-1)-th metal pattern MP21 of the sensing control line SEC may be connected to the sensing control connection line SECB through the sensing control contact hole SECT penetrating the gate insulating layer 130 and the buffer layer BF. As shown in FIG. 33, the (3-1)-th metal pattern MP32 of the third scan clock line SCC3 may be connected to the scan connection line SCB through the scan contact hole SCT penetrating the buffer layer BF. As shown in FIG. 34, the (4-1)-th metal pattern MP41 of the third sensing clock line SEC3 may be connected to the sensing connection line SEB through the sensing contact hole SET penetrating the buffer layer BF.

On the gate insulating layer 130, the gate electrode DT_G, the source electrode DT_S, the drain electrode DT_D, the first capacitor electrode CE1, and the (1-2)-th metal pattern MP12 of each of the carry clock lines CRC1 to CRC3, the (3-2)-th metal pattern MP32 of each of the scan clock lines SCC1 to SCC4, and the (4-2)-th metal pattern MP42 of each of the sensing clock lines SEC1 to SEC4 may be formed. Further, on the gate insulating layer 130, the (2-1)-th metal pattern MP21 of each of the sensing control line SES, the control clock line SCK, the gate-on voltage line VOL, the first gate-off voltage line VOF1, and the second gate-off voltage line VOF2 may be formed. The planarization layer 160 may be formed on the gate electrode DT_G, the first capacitor electrode CE1, the (1-2)-th metal pattern MP12, the (3-2)-th metal pattern MP32, the (4-2)-th metal pattern MP42, and the (2-1)-th metal pattern MP21.

As shown in FIG. 30, the source electrode DT_S may be connected to the light blocking layer BML through the contact hole penetrating the buffer layer BF and the gate insulating layer 130, and the first capacitor electrode CE1 may be disposed to overlap the second capacitor electrode CE2. As shown in FIG. 31, the (1-2)-th metal pattern MP12 of the first carry clock line CRC1 may be connected to the (1-1)-th metal pattern MP11 through the first contact hole CT1 penetrating the gate insulating layer 130 and the buffer layer BF. As shown in FIG. 33, the (3-2)-th metal pattern MP32 of the third scan clock line SCC3 may be connected to the (3-1)-th metal pattern MP31 through the fourth contact hole CT4 penetrating the gate insulating layer 130 and the buffer layer BF. As shown in FIG. 34, the (4-1)-th metal pattern MP41 of the third sensing clock line SEC3 may be connected to the (4-1)-th metal pattern MP41 through the sixth contact hole CT6 penetrating the gate insulating layer 130 and the buffer layer BF.

The first electrode 171 and the pixel defining layer 180 may be formed on the planarization layer 160. As shown in FIG. 30, the first electrode 171 may be connected to the light blocking layer BML through the contact hole penetrating the buffer layer BF, the gate insulating layer 130, and the planarization layer 160.

In accordance with the embodiment of FIGS. 30 to 34, the display device may be manufactured while minimizing the number of photomask processes, so that it is possible to reduce a manufacturing cost.

Although the embodiments of the present invention have been described above with reference to the accompanying drawings, those of ordinary skill in the art to which the present invention pertains may be embodied in other specific forms without changing the technical spirit or essential features of the present invention. you will be able to understand Therefore, it should be understood that the embodiments described above are illustrative in all respects and not restrictive.

The invention claimed is:

1. A scan signal driving unit comprising:
a plurality of stages configured to sequentially output scan signals;
first clock lines to which first clock signals are applied;
second clock lines to which second clock signals are applied; and
first connection lines configured to connect the plurality of stages and the first clock lines,
wherein:
the first connection lines extend in a first direction, and the first clock lines and the second clock lines extend in a second direction crossing the first direction;
each of the first clock lines includes a (1-1)-th metal pattern and a (1-2)-th metal pattern disposed on the (1-1)-th metal pattern;
each of the second clock lines includes a (2-1)-th metal pattern disposed on the same layer as one of the (1-1)-th metal pattern and the (1-2)-th metal pattern;
the (1-1)-th metal pattern and the (1-2)-th metal pattern are disposed on the first connection lines;
a width of the (1-1)-th metal pattern in a first area overlapping the first connection lines is less than a width of the (1-1)-th metal pattern in a second area not overlapping the first connection lines; and
a width of the (1-2)-th metal pattern in the first area is same as a width of the (1-2)-th metal pattern in the second area.

2. The scan signal driving unit of claim 1, wherein a minimum distance between one of the plurality of stages and one of the first clock lines is greater than a minimum distance between one of the plurality of stages and one of the second clock lines.

3. The scan signal driving unit of claim 1, further comprising
second connection lines configured to connect the plurality of stages and the second clock lines.

4. The scan signal driving unit of claim 3, wherein a length of one of the first connection lines is greater than a length of one of the second connection lines.

5. The scan signal driving unit of claim 3, wherein one of the first connection lines overlaps the (1-2)-th metal pattern of one of the first clock lines, and does not overlap the (1-1)-th metal pattern of the first clock line.

6. The scan signal driving unit of claim 3, wherein:
each of the first clock lines includes a (1-3)-th metal pattern disposed under the (1-1)-th metal pattern; and
each of the second clock lines includes a (2-2)-th metal pattern disposed on the same layer as the (1-3)-th metal pattern.

7. The scan signal driving unit of claim 6, wherein one of the first connection lines overlaps the (1-3)-th metal pattern of one of the first clock lines.

8. The scan signal driving unit of claim 3, further comprising third clock lines to which third clock signals are applied,
wherein each of the third clock lines includes a (3-1)-th metal pattern disposed on the same layer as the (1-1)-th metal pattern and a (3-2)-th metal pattern disposed on the same layer as the (1-2)-th metal pattern.

9. The scan signal driving unit of claim 8, wherein a minimum distance between one of the plurality of stages and one of the third clock lines is greater than a minimum distance between one of the plurality of stages and one of the second clock lines.

10. The scan signal driving unit of claim 8, further comprising third connection lines configured to connect the plurality of stages and the third clock lines.

11. The scan signal driving unit of claim 10, wherein a length of one of the third connection lines is greater than a length of each one of the second connection lines.

12. The scan signal driving unit of claim 10, wherein one of the third connection lines overlaps the (3-2)-th metal pattern of one of the third clock lines, and does not overlap the (3-1)-th metal pattern of the one of the third clock lines.

13. The scan signal driving unit of claim 8, wherein each of the third clock lines includes a (3-3)-th metal pattern disposed under the (3-1)-th metal pattern.

14. The scan signal driving unit of claim 13, wherein one of the third connection lines overlaps the (3-3)-th metal pattern of one of the third clock lines.

15. A display device comprising:
a display panel including data lines, scan signal lines and sensing signal lines intersecting the data lines, and pixels connected to the data lines, the scan signal lines, and the sensing signal lines;
a data driver configured to apply data voltages to the data lines; and
a scan signal driving unit including a plurality of stages configured to sequentially apply scan signals to the scan signal lines, and to sequentially apply sensing signals to the sensing signal lines,
wherein:
the scan signal driving unit further includes:
first clock lines to which first clock signals are applied;
second clock lines to which second clock signals are applied;
first connection lines configured to connect the plurality of stages and the first clock lines, and
each of the first clock lines includes a (1-1)-th metal pattern and a (1-2)-th metal pattern disposed on the (1-1)-th metal pattern;
each of the second clock lines includes a (2-1)-th metal pattern disposed on the same layer as one of the (1-1)-th metal pattern and the (1-2)-th metal pattern;
a number of metal patterns of the first clock lines is different from a number of metal patterns of the second clock lines;
a width of the (1-1)-th metal pattern in a first area overlapping the first connection lines is smaller than a width of the (1-1)-th metal pattern in a second area not overlapping the first connection lines; and wherein a width of the (1-2)-th metal pattern in the first area is same as a width of the (1-2)-th metal pattern in the second area.

16. The display device of claim 15, wherein:
the thin film transistor further includes:
   a source electrode disposed on the gate electrode and connected to the source region; and
   a drain electrode disposed on the gate electrode and connected to the drain region.

17. The display device of claim 16, wherein the (1-2)-th metal pattern is disposed on the same layer as the source electrode.

18. The display device of claim 16, wherein the (1-2)-th metal pattern is disposed between the gate electrode and the source electrode.

* * * * *